(12) United States Patent
MacNeil et al.

(10) Patent No.: US 9,067,511 B2
(45) Date of Patent: Jun. 30, 2015

(54) THERMOFORMED VEHICLE FLOOR TRAY WITH TREADS

(71) Applicant: MacNeil IP LLC, Bolingbrook, IL (US)

(72) Inventors: David F. MacNeil, Hinsdale, IL (US); Scott A. Vargo, Lombard, IL (US)

(73) Assignee: MacNeil IP LLC, Bolingbrook, IL (US)

( * ) Notice: Subject to any disclaimer, the term of this patent is extended or adjusted under 35 U.S.C. 154(b) by 0 days.

(21) Appl. No.: 14/565,040

(22) Filed: Dec. 9, 2014

(65) Prior Publication Data

US 2015/0084365 A1 Mar. 26, 2015

Related U.S. Application Data

(60) Continuation of application No. 13/773,706, filed on Feb. 22, 2013, now Pat. No. 8,910,995, which is a continuation of application No. 13/595,703, filed on Aug. 27, 2012, now Pat. No. 8,382,186, which is a (Continued)

(51) Int. Cl.
*B60R 13/00* (2006.01)
*B60N 3/04* (2006.01)
*B29D 99/00* (2010.01)

(Continued)

(52) U.S. Cl.
CPC ............ *B60N 3/044* (2013.01); *B29D 99/0057* (2013.01); *G06F 17/5086* (2013.01); *Y10T 29/49622* (2015.01); *Y10T 428/31909* (2015.04); *Y10T 428/31917* (2015.04); *B60N 3/048* (2013.01); *B60R 21/02* (2013.01);

(Continued)

(58) Field of Classification Search
CPC ............... B60N 3/044; B29D 99/0057; Y10T 29/49622; B29C 45/76; G06F 17/50; B29L 2031/3017
USPC ....................................... 296/97.23
See application file for complete search history.

(56) References Cited

U.S. PATENT DOCUMENTS

| | | |
|---|---|---|
| 2,188,342 A | 1/1940 | England |
| 2,709,105 A | 5/1955 | Kramer |

(Continued)

FOREIGN PATENT DOCUMENTS

| | | | |
|---|---|---|---|
| CA | 1101016 A | 5/1981 | |
| CA | 1198466 A | 12/1985 | |

(Continued)

OTHER PUBLICATIONS

Husky Liner for 1999 Ford Super Duty, downloaded from http://www.huskyliners.com/superduty.html on Jan. 3, 2005.

(Continued)

*Primary Examiner* — Pinel Romain

(74) *Attorney, Agent, or Firm* — Perkins IP Law Group LLC; Jefferson Perkins

(57) ABSTRACT

In a vehicle floor tray thermoformed from a sheet of thermoplastic polymeric material of substantially uniform thickness, a central panel includes a reservoir that has plural elongate hollow baffles which act to elevate the foot or shoe of the occupant above fluid collected by the reservoir, and also act to impede lateral movement of fluid in the reservoir. Heights of first and second side panels, measured at their junction, are substantially similar to each other. The vehicle floor tray may be one of a product line of such floor trays having the same functional characteristics but substantially conforming to respective and differently shaped foot wells in different vehicles.

20 Claims, 12 Drawing Sheets

Related U.S. Application Data continuation of application No. 12/879,899, filed on Sep. 10, 2010, now Pat. No. 8,267,459, which is a continuation of application No. 11/463,203, filed on Aug. 8, 2006, now abandoned, which is a division of application No. 10/976,441, filed on Oct. 29, 2004, now Pat. No. 7,316,847.

(51) Int. Cl.
  *G06F 17/50* (2006.01)
  *B60R 21/02* (2006.01)
  *B29C 45/76* (2006.01)
  *B29L 31/30* (2006.01)

(52) U.S. Cl.
  CPC ............ *B29C 45/76* (2013.01); *B29K 2023/06* (2013.01); *G06F 17/50* (2013.01); *B29L 2031/3017* (2013.01)

(56) References Cited

U.S. PATENT DOCUMENTS

| | | |
|---|---|---|
| 3,087,752 A | 4/1963 | Winchester |
| 3,149,875 A | 9/1964 | Stata |
| 3,288,187 A | 11/1966 | Wheaton |
| 3,387,315 A | 6/1968 | Stata |
| 3,390,912 A | 7/1968 | Stata |
| 3,391,959 A | 7/1968 | Stata |
| 3,401,975 A | 9/1968 | Oger |
| 3,424,265 A | 1/1969 | Stata |
| 3,450,429 A | 6/1969 | Stata |
| 3,488,081 A | 1/1970 | Nolen |
| 3,557,654 A | 1/1971 | Weidner, Jr. |
| 3,605,166 A | 9/1971 | Chen |
| D242,136 S | 11/1976 | Matlock |
| 4,211,447 A | 7/1980 | Divincenzo |
| 4,280,729 A | 7/1981 | Morawski |
| 4,382,986 A | 5/1983 | Reuben |
| 4,406,492 A | 9/1983 | Cackowski |
| 4,420,180 A | 12/1983 | Dupont et al. |
| D278,525 S | 4/1985 | Morawski |
| 4,579,764 A | 4/1986 | Peoples, Jr. et al. |
| 4,591,532 A | 5/1986 | Tanaka |
| D288,799 S | 3/1987 | Peress |
| 4,693,507 A | 9/1987 | Dresen et al. |
| 4,721,641 A | 1/1988 | Bailey |
| 4,828,898 A | 5/1989 | Bailey |
| 4,921,742 A | 5/1990 | Altus |
| D313,789 S | 1/1991 | Thundercloud |
| 5,019,993 A | 5/1991 | Montalcini et al. |
| 5,208,995 A | 5/1993 | McKendrick |
| 5,254,384 A | 10/1993 | Gordon |
| D342,932 S | 1/1994 | Primeau |
| D358,571 S | 5/1995 | Thundercloud |
| 5,474,829 A | 12/1995 | Woosley |
| 5,482,759 A | 1/1996 | Primeau |
| D372,011 S | 7/1996 | Tyler |
| D377,780 S | 2/1997 | MacNeil |
| 5,725,926 A | 3/1998 | Wang |
| D393,238 S | 4/1998 | Kraines |
| D394,037 S | 5/1998 | Mauffette |
| 5,776,583 A | 7/1998 | Peyton |
| 5,830,560 A | 11/1998 | Koa |
| 5,856,828 A | 1/1999 | Letcher, Jr. |
| D408,342 S | 4/1999 | Yang |
| 5,891,546 A | 4/1999 | Sherman |
| 5,919,540 A | 7/1999 | Bailey |
| 6,007,319 A | 12/1999 | Jacobson |
| D420,965 S | 2/2000 | Iacovelli et al. |
| 6,022,503 A | 2/2000 | Hudkins et al. |
| 6,027,782 A | 2/2000 | Sherman |
| D422,256 S | 4/2000 | Lu |
| D425,005 S | 5/2000 | Rizvi |
| 6,058,618 A | 5/2000 | Hemmelgarn et al. |
| D429,204 S | 8/2000 | Lu |
| D432,478 S | 10/2000 | Lu |
| 6,155,629 A | 12/2000 | Sherman |
| D442,530 S | 5/2001 | Lu |
| 6,261,667 B1 | 7/2001 | Yang |
| D454,323 S | 3/2002 | Lu |
| D454,324 S | 3/2002 | Lu |
| D457,845 S | 5/2002 | Kraines |
| 6,431,629 B1 | 8/2002 | Emery |
| D471,850 S | 3/2003 | Kraines |
| 6,534,146 B1 | 3/2003 | Mentz, Jr. |
| 6,578,896 B1 | 6/2003 | Peterson |
| 6,605,333 B2 | 8/2003 | Ferreira et al. |
| 6,677,027 B1 | 1/2004 | Lu |
| D489,306 S | 5/2004 | Kraines |
| 6,732,030 B2 | 5/2004 | Jones |
| 6,736,442 B2 | 5/2004 | Gebreselassie et al. |
| D491,122 S | 6/2004 | Kraines |
| 6,793,872 B1 | 9/2004 | Buss |
| 6,794,013 B1 | 9/2004 | Iacovelli et al. |
| 6,804,568 B1 | 10/2004 | Miyazaki et al. |
| D499,057 S | 11/2004 | Lafleur |
| 6,817,649 B1 | 11/2004 | Stanesic |
| 6,953,545 B1 | 10/2005 | Tyler |
| D525,576 S | 7/2006 | Lu |
| 7,215,430 B2 | 5/2007 | Kacyra et al. |
| 7,316,847 B2 | 1/2008 | MacNeil |
| 7,401,837 B2 | 7/2008 | MacNeil |
| 7,444,748 B2 | 11/2008 | MacNeil |
| 7,607,713 B2 | 10/2009 | MacNeil |
| 2001/0020316 A1 | 9/2001 | Ferreira et al. |
| 2002/0045029 A1 | 4/2002 | Yung |
| 2003/0143358 A1 | 7/2003 | Needles |
| 2004/0048036 A1 | 3/2004 | Nakasuji et al. |
| 2004/0224130 A1 | 11/2004 | Melucci et al. |
| 2005/0191459 A1 | 9/2005 | Ferreira et al. |
| 2006/0091694 A1 | 5/2006 | MacNeil |
| 2006/0288578 A1 | 12/2006 | MacNeil |
| 2007/0110950 A1 | 5/2007 | Yang |
| 2008/0061580 A1 | 3/2008 | MacNeil |
| 2009/0092795 A1 | 4/2009 | MacNeil |
| 2009/0230717 A1 | 9/2009 | MacNeil |

FOREIGN PATENT DOCUMENTS

| | | |
|---|---|---|
| CA | 1292028 A | 11/1991 |
| CA | 1302459 | 6/1992 |
| CA | 2431099 A | 1/2004 |
| DE | 1863477 U | 12/1962 |
| DE | 8434890 U1 | 2/1985 |
| DE | 19928720 A1 | 1/2001 |
| EP | 0258162 A2 | 3/1988 |
| EP | 0379630 A1 | 8/1990 |
| EP | 0968875 B1 | 1/2000 |
| JP | 1172040 A | 7/1989 |
| JP | H3-47245 | 5/1991 |
| JP | 406227305 A | 8/1994 |
| JP | H8-85377 | 4/1996 |
| JP | 8332976 A | 12/1996 |
| JP | 3039625 A | 5/1997 |
| JP | 11268570 A | 10/1999 |
| JP | H11-268570 | 10/1999 |
| JP | 200052835 | 2/2000 |
| JP | 2002-362209 A | 12/2002 |
| JP | 2002356124 | 12/2002 |
| JP | 2004122901 A | 4/2004 |
| WO | 95/34443 A1 | 12/1995 |

OTHER PUBLICATIONS

Autoform Trunk Liner, English web page, downloaded from http://www.autoform.se/eng/products_trunk_liners.htm on Oct. 20, 2004.
"Installation Instructions for Your F-150/F-250 Ford Truck Front Floor Liners", Winfield Consumer Products, Feb. 1, 2001, downloaded from http://www.huskyliners.com on Jan. 3, 2005.
Husky Deep Tray Floor Liner, downloaded from http://www.truckstuffusa.com/cusfitdeeptr.html on Jan. 3, 2005.
Web pages featuring products from 3D Carpet Liners, Weatherboots, Nifty Products, Inc. and Husky, downloaded from http://www.premiermotoring.net on Aug. 11, 2004.

(56) References Cited

OTHER PUBLICATIONS

WeatherTech Floor Mat and Cargo Liner Product Sheets, MacNeil Automotive Products Limited, Downers Grove, IL, Nov. 1994, 4 pp.
Faro Laser ScanArm, downloaded from http://www.faro.com/Products/ScanArm.asp on Sep. 23, 2004.
Faro ScanArm Product Techsheet, downloaded from http://www.faro.com/Products/Product_Techsheet.asp? techsheet_id=106 on Oct. 11, 2004.
"CMM Produces Bikes With Custom-Look", downloaded from http://manufacturingcenter.com/man/ articles/0604/0604CMM.asp on Oct. 11, 2004.
"Stereolithography (SLA) for Rapid Precision Prototypes", p. 1, downloaded from http://www.boedeker.com/sla.htm on Oct. 12, 2004.
"About Coordinate Measuring Machines (CMM)", downloaded from http://cmm.globalspec.com on Oct. 11, 2004.
"Bagagerumsmattor", downloaded from http://www.autoform.se/sv/produkter_bagagerumsmattor.htm on Oct. 20, 2004.
Strictly Catalog for Explorer/Mountaineer/Expedition/Navigator. MacNeil Automotive Products Limited, Downers Grove, IL, 1999, pp. 1-2 and 4-7.
British Patent Office, Search Report on GB Patent Appln. No. GB 0522091.8, Claims 47-66, 77 and 78, Jun. 23, 2006.
British Patent Office, Search Report on Patent Appln. No. GB 0522091.8, Claims 67-70, Jun. 26, 2006.
British Patent Office, Search Report on Patent Appln. No. GB 0522091.8, Claims 71-73, Jun. 27, 2006.
British Patent Office, Search Report on Patent Appln. No. GB 0522091.8, Claims 79-84 and 101-105, Jun. 23, 2006.
British Patent Office, Search Report on Patent Appln. No. GB 522091.8, claims 85-100, Jun. 27, 2006.
British Patent Office, Search Report on Patent Appln. No. GB 0522091.8, claims 1-46 and 74-76, Feb. 14, 2006.
Canadian Intellectual Property Office, Requisition by Examiner issued on Canadian Application No. 2,524,795 on Apr. 23, 2008.
U.S. Patent and Trademark Office, Office Action issued on U.S. Appl. No. 11/463,215 on Nov. 27, 2007.
U.S. Patent and Trademark Office, Office Action issued on U.S. Appl. No. 11/463,215 on Jun. 6, 2007.
British Patent Office, Search Report issued on GB Application No. 0625354.6 dated Nov. 6, 2007.
British Patent Office, Search Report on GB Appln. No. 0625354.6 dated Mar. 3, 2008.
Japanese Patent Office, Rejection issued in connection with Japanese Patent Application No. 2005-317635 dispatched on Jan. 5, 2011.
Canadian Intellectual Property Office, Requisition by the Examiner issued in connection with Canadian Patent Application No. 2,672,095, Jan. 14, 2011.
Photographs of Ford Windstar floor mat with unknown manufacture date, obtained by Applicant in 2010, and believed to be on sale and in public use prior to Oct. 29, 2003.
Canadian Intellectual Property Office, Requisition by the Examiner issued in connection with Canadian Patent Application No. 2,672,423, Dec. 14, 2010.
Japanese Patent Office, Notice of Reasons for Rejection issued for Japanese Patent Application No. 2011-015999 on Nov. 26, 2012.
Japanese Patent Office, Notice of Reasons for Rejection issued for Japanese Patent Application No. 2011-039529 on Nov. 28, 2012.
U.S. Patent and Trademark Office, Office Action issued on U.S. Appl. No. 11/463,203 on Aug. 13, 2009.
U.S. Patent and Trademark Office, Office Action issued on U.S. Appl. No. 11/934,320 on Jun. 10, 2009.
U.S. Patent and Trademark Office, Office Action issued on U.S. Appl. No. 12/332,757 on Jun. 11, 2009.
Canadian Intellectual Property Office, Requisition by the Examiner dated Dec. 17, 2009 on Canadian Patent Application No. 2,672,116.
Canadian Intellectual Property Office, Requisition on CA 2,672,095, dated Jan. 14, 2011.
German Patent and Trademark Office, Official Action on DE 10 2005 063 533.4-21, dated Sep. 1, 2011.
Canadian Intellectual Property Office, Requisition on CA 2,672,097, dated on Dec. 19, 2011.
Photographs of a Highland Floor Guard with unknown date of manufacture, obtained by Applicant in 2010, and believed to be on sale and in public use prior to Oct. 29, 2003.
American Specialty Equipment Corp., "Big Book" catalog for "Performance Parts, Truck Accessories, and Sport Compact Equipment," 2000, p. 366.
Add-On 2002-2003 Automotive Accessory Catalog, 2002, pp. 192 and 447.
Floor Mat Comparison Chart, Stylinconcepts.com, Jun. 2, 2002.
Advertisement for Highland's Black Armor Floor Guard, Stylin Concepts "Custom Truck Accessories" catalog, 2003, pp. 1, 2 and 109.
Image from advertisement for Black Armor Floor Guard, Stylinconcepts.com; Apr. 3, 2002, recovered from http://webarchive.org/20020403230231/stylinconcepts.com/Images/BlackArmorWLogo.jpg.
List of "front custom auto floor mats", etrailer.com (as downloaded by web.archive.org), Jun. 4, 2004.
Description and illustration of "Front Custom Auto floor Mats"; etrailer.com (as downloaded by web.archive.org), Jun. 4, 2004.
Advertisement for Highland floor guards, Counterman Info Pages, prior to Nov. 2002, p. 27.
Highland Catalog and Jobber sheet; prior to 2004.
Highland Application Guide, 2004.
Volvo Accessories brochure, 1990, pp. 1 and 23.
Volvo 760 GLE Accessories Brochure, 1983, pp. 1-3.
Volvo Accessories brochure, 1981, pp. 1, 27.
Volvo Accessories brochure, 1983, p. 1, 11, 16.
Photographs of Volvo floor mat with unknown manufacture date, obtained by Applicant in 2010, and believed to be on sale and in public use prior to Oct. 29, 2003.
Photographs of a Husky Liner floor tray with unknown manufacture date, obtained by Applicant in 2010, and believed to be on sale and in public use prior to Oct. 29, 2003.
Husky Liners Product Catalog, 2001, pp. 1-2.
Husky Liners Product Catalog, 2002, selected pages.
Husky Liners Product Catalog, 2003 1/2 , SEMA Show Edition, selected pages.
Photographs of Winfield's Husky Liner Model 3780 for 2000-2001 BMW X-5 possessed by Applicant, believed to be on sale and in public use prior to Oct. 29, 2003.
1998 Lund Product Catalog, p. 24, Lund SportMat Molded Floor Trays.
Web advertisement for Fox Weatherboots, foxweatherboots.com (as downloaded by web.archive.org), Mar. 3, 2000.
Nifty Products Catalog, 2003-2004, selected pages.
Advertisement of unknown publication date for Husky Liner 3D Molded Carpeted Front Floor Liners, obtained by Applicant in 2010, and believed to be on sale and in public use prior to Oct. 29, 2003.
Photographs of Husky Liner 3D Floor Liners manufactured Aug. 2010, in possession of Applicant, and believed to be on sale and in public use prior to Oct. 29, 2003.
Geomagic Press Release, "Geomagic, Inc. Wins Second Computer Graphics World Innovation Award," Dec. 10, 1998.
Geomagic Press Release, "Geomagic to Introduce Unique Solution for 3D Content Creation at Siggraph '99," Aug. 3, 1999.
Geomagic Press Release, "Geomagic Announces Geomagic Studio 2.0," Jan. 14, 2000.
Geomagic Press Release, "Geomagic, QTE Offer RevQuick, Automatic Surface Generation for Mastercam," Sep. 25, 2000.
Advertisement, "Third Party Options (Romer, A CimCore Company)," 2000.
Son, Seokbae; Park, Hyunpung; and Lee, Kwan; "Automated laser scanning system for reverse engineering and inspection," Int. J. Machine Tools & Manufacture, 42, 889-897 (2002).
"Competition Rising in Portable CMMs," Quality Magazine, May 5, 2003.
Press Release by Brown and Sharpe, "Portable K Series Optical CMMs," Sep. 1, 2002.

(56) References Cited

OTHER PUBLICATIONS

"CAM2 software," as downloaded from http://web.archive.org/web/20040215065613/www.faro.com/Products on Nov. 4, 2010.

"Laser Scanner edges out CMM in the race to market," Machine Design.com, Feb. 5, 2004.

"Highres Delivers Complete Reverse Engineering Software Suite for SolidWorks 2001Plus," Reverse Engineering.com, Apr. 25, 2002.

"HighRes Provides 3D Reverse Engineering Software to Higher Education Learning Institutions", ReverseEngineering.com, May 21, 2002.

"HighRes Reverse Engineering Software now Ships with Every Romer 3000i and Stinger II Portable CMM in North America," ReverseEnginering.com, Oct. 14, 2002.

Press Release, "FARO Debuts Affordable "Advantage" Line of Measurement Products," Sep. 4, 2003.

Canadian Intellectual Property Office, Requisition by the Examiner in connection with Canadian Patent Application No. 2,672,423 dated Dec. 14, 2010.

THERMOFORMED VEHICLE FLOOR TRAY WITH TREADS

RELATED APPLICATIONS

This application is a continuation copending U.S. Nonprovisional application Ser. No. 13/773,706 filed Feb. 22, 2013, which in turn is a continuation of U.S. Nonprovisional application Ser. No. 13/595,703 filed on Aug. 27, 2012, now U.S. Pat. No. 8,382,186, which is in turn a continuation of U.S. Nonprovisional application Ser. No. 12/879,899 filed on Sep. 10, 2010, now U.S. Pat. No. 8,267,459, which is in turn a continuation of U.S. Nonprovisional application Ser. No. 11/463,203 filed on Aug. 8, 2006, now abandoned, which is in turn a division of U.S. Nonprovisional application Ser. No. 10/976,441 filed on Oct. 29, 2004, now U.S. Pat. No. 7,316,847. The disclosures and drawings of the aforementioned applications are fully incorporated by reference herein.

BACKGROUND OF THE INVENTION

Motor vehicles are almost always operated in the out of doors and are frequently parked there. It is therefore very common for their occupants to have wet or muddy feet—if the occupants have not just finished an outdoor activity, at least they have had to walk across a possibly wet, snowy or muddy surface to access their vehicles. For decades, therefore, vehicle owners have been attempting to protect the enclosed interiors of their vehicles (cars, trucks, SUVs) from what they themselves track into them. The conventional solution to this has been to provide a vehicle floor mat which may be periodically removed by the owner and cleaned.

Human beings have a tendency to move their feet around, and foot motion is an absolute requirement in operating most vehicles. This has caused a problem, in that the occupants of a vehicle have a tendency to push around the floor mats with their feet. The floor mats end up not being centered on the area protected, or pushed up so as to occlude the gas, brake or clutch pedals, or bunched up or folded over—all undesirable conditions. One objective of floor mat manufacturers has therefore been to provide a floor mat that will stay put and which will not adversely affect vehicle operation.

The foot wells of cars, trucks and SUVs vary in size in shape from one model of vehicle to the next. Floor mat manufacturers have noticed that floor mats which at least approximately conform to the shape of the bottom surface of the foot well stay in place better and offer more protection. It is also common for such floor mats, where provided for front seat foot wells, to have portions which are meant to lie against the firewalls or front surfaces of the foot wells. Even as so extended it is not too hard to provide a floor mat of flexible material that will approximately conform to these two surfaces, as the designer only has to mark a two-dimensional periphery of the mat in providing one which will fit reasonably well.

More recently, vehicle floor trays have come onto the market. Most front-seat vehicle foot wells are actually three-dimensional concave shapes, typically with complex curved surfaces. Floor trays have sidewalls that offer enhanced protection to the surfaces surrounding the vehicle floor, as might be needed against wearers with very muddy or snowy shoes. Conventional vehicle floor trays try to fit into these three-dimensional cavities, but so far their fit to the surfaces that they are supposed to protect has been less than optimum. A conventional vehicle floor tray is typically molded of a single-ply rubber or plastic material, exhibits enough stiffness to retain a three-dimensional shape, but is also at least somewhat flexible. Fitting such a tray to the complex three-dimensional surface of a vehicle foot well has proven to be difficult, and the products currently in the marketplace have limited consumer acceptance because of their loose fit inside the foot well. There is often, and in many places, a considerable space between the exterior wall of these conventional trays and the interior surface of the foot well. This causes the wall to noticeably deform when the occupant's foot contacts it. Vehicle owners have a tendency to dislike floor trays which rattle, deform, shift and flop about. A need therefore persists for a floor tray that will have a more exact fit to the vehicle foot well for which it is provided, that stays in place once it is installed, and that provides a more solid and certain feel to the occupants' feet.

Some vehicle floor mats that are now on the market have fluid reservoirs built into them. Particularly in cold or wet climates, dirty water has a tendency to be shed onto the floor mat, where it persists until it evaporates. If there is enough of it, it will leak off of the floor mat and stain the carpeting of the foot well that the mat was meant to protect. These reservoirs typically are recessed areas in the mats that provide the mats with an enhanced ability to retain snow-melt and the like, until the water evaporates or can be disposed of by the vehicle owner or user. One advanced design places treads in the middle of the reservoir, such that the feet of the occupant are held above any fluid that the reservoir collects. But including such a reservoir within a floor tray that otherwise has an acceptable fit to the surface of a vehicle foot well has not yet been done, since there are problems in incorporating a three-dimensional liquid-holding vessel into a product that ideally conforms, on its lower surface, to the surface of the foot well. Further, a reservoir which collects drip water from a large surface, such as a vehicle floor tray, will exhibit more problems in keeping the collected fluid from sloshing about in a moving vehicle.

Conventional vehicle floor mats and trays are molded from a single rubber or plastic material. The selection of this material is controlled by its cost, its resistance to shear forces, its tensile strength, its abrasion resistance, its ability to conform to the surface of the vehicle foot well, its sound-deadening properties and how slippery or nonslippery it is relative to the occupants' feet, with nonslipperiness (having a relatively high coefficient of friction) being advantageous. Often the designer must make tradeoffs among these different design constraints in specifying the material from which the tray or mat is to be made.

SUMMARY OF THE INVENTION

According to one aspect of the invention, there is provided a vehicle floor cover, mat or tray which is removably installable by a consumer and which is formed of at least three layers that are bonded together, preferably by coextrusion. The three layers include a central layer whose composition is distinct from a bottom layer and a top layer. Preferably, all three layers are formed of thermoplastic polymer materials. In another aspect of the invention, the top layer exhibits a kinetic coefficient of friction with respect to a sample meant to emulate a typical shoe outsole (neoprene rubber, Shore A Durometer 60) of at least about 0.82.

Preferably, a major portion of the central layer is a polyolefin. More preferably, the polyolefin is either a polypropylene or a polyethylene. Most preferably, the polyolefin is high molecular weight polyethylene (HMPE) as herein defined. In an alternative embodiment, the central layer can be a styrene-acrylonitrile copolymer (SAN) or an acrylonitrile-butadiene-styrene (ABS) polymer blend.

Preferably, a major portion of the top layer is a thermoplastic elastomer, such as one of the proprietary compositions sold under the trademarks SANTOPRENE®, GEOLAST® and VYRAM®. VYRAM® is particularly preferred. In another embodiment, a major portion of the top layer can be an ABS polymer blend. Where ABS is used in both the top and central layers, it is preferred that the amount of the polybutadiene phase in the top layer be greater than the amount of this phase in the central layer.

It is further preferred that a major portion of the bottom layer likewise be a thermoplastic elastomer, and conveniently it can be, but does not have to be, of the same composition as the major portion of the top layer.

Preferably one or more of the layers is actually a polymer blend, in which a minor portion is preselected for its coextrusion compatibility with the adjacent layer(s). Thus, a minor portion of the top and bottom layers can consist of a polyolefin, while a minor portion of the central layer can consist of a thermoplastic elastomer. In each case, it is preferred that the minor portion be no more than about one part in four by weight of each layer, or a weight ratio of 1:3. Where all three layers are preselected to be ABS blends, the amount of polybutadiene preferably is decreased in the central layer relative to the top and bottom layers.

While the preferred embodiment of the vehicle floor cover consists of three integral layers, any one of the recited layers can in fact be made up of two or more sublayers, such that the total number of sublayers in the resultant mat or tray can exceed three.

In another embodiment, the thermoplastic elastomer constituent of the top, central and/or bottom layers described above can be replaced with a natural or synthetic rubber, including styrene butadiene rubber, butadiene rubber, acrylonitrile butadiene rubber (NBR) or ethylene propylene rubber (EPDM).

According to a related aspect of the invention, a vehicle floor cover is provided that has three layers bonded together, preferably by coextrusion. Major portions of the top and bottom layer consist of thermoplastic elastomer(s). The top and bottom layers have compositions distinct from the central layer, which can be chosen for its relatively low expense. It is preferred that a major portion of the central layer be a polyolefin and that major portions of the top and bottom layers be one or more thermoplastic elastomers. The polyolefin may be selected from the group consisting of polypropylene and polyethylene, and preferably is a high molecular weight polyethylene (HMPE). The thermoplastic elastomer can, for example, be SANTOPRENE®, GEOLAST® or VYRAM®, with VYRAM® being particularly preferred. It is also preferred that each of the layers be a polymer blend, with a minor portion of each layer being chosen for its coextrusion compatibility with adjacent layers. For example, the top and bottom layers can consist of a 3:1 weight ratio of VYRAM®/HMPE, and the central layer of a 3:1 weight ratio of HMPE/VYRAM®.

In an embodiment alternative to the one above, the top and bottom layers can consist of ABS polymer blends and the central layer can consist of SAN or an ABS in which the polybutadiene phase is present in a smaller concentration than in the top and bottom layers.

In yet another embodiment, the thermoplastic elastomer recited in this aspect of the invention may be replaced with a natural or synthetic rubber, such as styrene butadiene rubber (SBR), butadiene rubber, acrylonitrile butadiene rubber (NBR) or ethylene propylene rubber (EPDM).

In a further aspect of the invention, a vehicle floor tray or mat according to the invention is made of three layers, wherein a top layer and a bottom layer have composition(s) distinct from the central layer, and wherein at least one of the shear strength per cross-sectional area, tensile strength per cross-sectional area and stiffness per cross-sectional area is greater than any one of the layers from which the tray or mat is composed. It has been found that a triextruded vehicle mat or floor tray according to the invention exhibits a tensile strength at yield, a tensile stress at break, a tensile modulus, a shear strength and a flexural modulus (stiffness) which are superior to either a polyolefin-dominated single extrusion or a thermoplastic elastomer-dominated single extrusion. The triextrusion tray demonstrates these enhanced physical properties while at the same time affording an enhanced coefficient of friction to the feet of the occupant and improved tactile properties. By presenting such a surface to the shoe of the driver or passenger, the footing of the driver or passenger will be more sure and comfortable.

In a further aspect of the invention, a vehicle foot well tray is provided as a part of a system that has the vehicle foot well as its other main component. The tray has a greatly enhanced conformance to the surface of the vehicle foot well for which it is provided. At least two upstanding walls of the tray, both extending from the tray floor to a top margin, conform to respective surfaces of the vehicle foot well such that at least within that one-third of the area of the outer surface of these upstanding walls of the tray which is adjacent the top margin, 90% of that top third area departs by no more than about one-eighth of an inch from the foot well surfaces to which they mate. These upstanding tray surfaces may be opposed surfaces or adjacent surfaces, and preferably are both. In a preferred embodiment, the tray departs from a door sill surface of the vehicle foot well, and/or a sill curve of the vehicle foot well, by about 0.025 inches. The upstanding sidewalls of the floor tray conform to the foot well surfaces which they cover, even where such foot well surfaces present both concave and convex surface elements.

In a still further aspect of the invention, a top margin of a vehicle floor tray is substantially coplanar on at least two upstanding sidewalls thereof. Preferably, the top margin of the tray is substantially coplanar through three or even four continuous upstanding sidewalls. This eases the design of the floor tray, increases hoop strength and assures that all upstanding surfaces of the vehicle foot well will receive adequate protection from muddy footwear. In a particularly preferred embodiment, the plane of the top margin is forwardly and upwardly tilted relative to a horizontal floor. This provides enhanced protection to the vehicle foot well precisely in the place where muddy footwear are likely to be, near the accelerator, brake and clutch pedals or the firewall. In a preferred embodiment, the tray is at least five inches deep at its deepest part.

In a further aspect of the invention, the above mentioned tight tolerances are made possible by a novel vehicle floor tray manufacturing method. In a first step according to the invention, points on a surface of the vehicle foot well are digitally measured with a coordinate measuring machine (CMM). These points are stored in a computer memory. A foot well surface is generated which includes these points, preferably by connecting linear groups of the points together by using B-splines, and lofting between the B-splines to create areal portions of the foot well surface. Using this typically complex three-dimensional, predominately concave surface, which may have several concavely and convexly curved portions, a corresponding substantially convex outer floor tray surface is built up such that in many regions, the distance between the outer surface of the tray and the surface of the foot well is no more than about one eighth of an inch, insuring a snug fit.

In an embodiment of the invention, a process for manufacturing a vehicle floor tray includes a step of digitally measuring the three-dimensional position of a plurality of points on a substantially carpeted surface of a vehicle foot well for which the vehicle floor tray is to be provided. The points are stored in a memory. The stored points are used to construct an electronic model of the vehicle foot well surface. The electronic model of the vehicle foot well surface in turn is used to construct an electronic three-dimensional image of the vehicle floor tray. From this image, a vehicle tray data file is created. The vehicle tray data file is used to make a vehicle tray mold. The vehicle floor tray is manufactured by molding polymer material in the mold.

In one embodiment of the invention, a reservoir is incorporated into the tray floor as a collection and evaporation area for drip water from the feet and legs of the occupant. Combination baffles/treads are provided in the reservoir to impede lateral movement of the collected fluid. Longitudinal and transverse portions of these baffles are joined together. Channels are cut into another portion of the central area of the tray to direct fluid to the reservoir, such that the bottom of the channels is beneath a general tray floor surface but above the bottom of the reservoir. In a preferred driver's side embodiment, the channels are omitted from a portion of the floor tray upper surface to leave a blank space where the driver's heel will rest when operating the gas and brake pedals.

In a further aspect, a vehicle floor tray has a central panel that substantially conforms to the floor of a predetermined vehicle foot well. Integrally formed with the central panel are a generally transversely disposed first side panel that substantially conforms to a first foot well wall and a generally longitudinally disposed second side panel that substantially conforms to a second foot well wall. The first and second side panels extend upward from respective lateral sides of the central panel, to which they are joined by respective curved transitions. The first and second side panels are joined to each other, by a curved transition, at a first junction. A vertical height of the first side panel, as measured at the first junction and from an upper surface of the central panel to a top margin of the first side panel, is substantially similar to a vertical height of the second side panel, as measured at the first junction and from the upper surface of the central panel to a top margin of the second side panel. A reservoir is formed in the central panel for collection of snow melt and other fluid. Multiple upstanding baffles are disposed in the reservoir. As a result of the floor tray being thermoformed from a sheet of thermoplastic polymeric material of substantially uniform thickness, the thicknesses of the central panel, first panel, second panel, reservoir and baffles are substantially uniform throughout the tray. The baffles each have at least two opposed ends and are elongate. Each baffle is hollow and has a width, in any horizontal direction, which is more than twice its thickness as measured from the upper surface thereof to the nearest point on a lower surface thereof. The baffles are adapted to elevate the foot or shoe of an occupant out of the fluid collected by the reservoir. The baffles are also adapted to impede lateral movement of the collected fluid within the reservoir, as might occur when the vehicle turns, accelerates or brakes. The fluid is forced around ends of the treads/baffles in order to reach any remote portion of the reservoir. Since any portion of the reservoir is connected to any other portion of it, a large surface area of the reservoir is available for the collected fluid to spread out and evaporate.

In a further aspect of the invention, a product line includes a plurality of consumer-installable vehicle floor trays each thermoformed from a sheet of thermoplastic polymeric material of substantially uniform thickness. The product line includes a first, driver's side floor tray and a second, driver's side floor tray. The first driver's side floor tray has a first central panel that substantially conforms to the floor of a first driver's side vehicle foot well of a first vehicle. The first tray further has a first, upstanding, generally transversely disposed side panel that substantially conforms to a first wall of the first vehicle foot well, and a second, upstanding, generally longitudinally disposed side panel that substantially conforms to a second wall of the first vehicle foot well. The first and second side panels are joined at respective first and second lateral sides of the first central panel by respective curved transitions. The first and side panels further are joined to each other, by a curved transition, at a first junction. A vertical height of the first side panel, as measured, at the first junction, from the upper surface of the first central panel to the top margin of the first side panel is substantially similar to the vertical height of the second side panel, as measured, at the first junction, from the upper surface of the first central panel to the top margin of the second side panel. A first reservoir is formed in the first central panel. A plurality of upstanding, hollow, elongate first baffles are formed in the first reservoir, each to have at least two ends remote from each other. The first baffles are adapted to elevate the shoe or foot of an occupant above fluid collected in the reservoir. Any portion of the first reservoir is connected to a remote portion of the first reservoir by a path formed around ends of the first baffles. The first baffles have a thickness from the upper surface of the first central panel to an opposed lower surface thereof. Each of the first baffles has a width, in any lateral direction, of more than two times its thickness. Similarly, the second driver's side floor tray has a second central panel that substantially conforms to the floor of a second, driver's side vehicle foot well of a second vehicle. The second vehicle foot well has a shape that is different from the first vehicle foot well. The second tray further has a third, upstanding, generally transversely disposed side panel that substantially conforms to a third wall of the second vehicle foot well, and a fourth, upstanding, generally longitudinally disposed side panel that substantially conforms to a fourth wall of the second vehicle foot well. The third and fourth side panels are joined at respective third and fourth lateral sides of the second central panel by respective curved transitions. The third and fourth side panels further are joined to each other, by a curved transition, at a second junction. A vertical height of the third side panel, as measured, at the second junction, from the upper surface of the second central panel to the top margin of the fourth side panel is substantially similar to the vertical height of the fourth side panel, as measured, at the second junction, from the upper surface of the second central panel to the top margin of the fourth side panel. A second reservoir is formed in the second central panel. A plurality of upstanding, hollow, elongate second baffles are formed in the second reservoir, each to have at least two ends remote from each other. The second baffles are adapted to elevate the shoe or foot of an occupant above fluid collected in the second reservoir. Any portion of the second reservoir is connected to a remote portion of the second reservoir by a path formed around ends of the second baffles. The second baffles each have a thickness from the upper surface of the second central panel to an opposed lower surface thereof. Each of the second baffles has a width, in any lateral direction, of more than two times its thickness.

The product line may further include a third, passenger's side floor tray for a passenger's side foot well of the first vehicle and a fourth, passenger's side floor tray for a passenger's side foot well of the second vehicle. The third, passenger's side floor tray has a third central panel that substantially conforms to the floor of a third, passenger's side vehicle foot well of the first vehicle. The third tray further has a fifth, upstanding, generally transversely disposed side panel that substantially conforms to a fifth wall of the third vehicle foot well, and a sixth, upstanding, generally longitudinally disposed side panel that substantially conforms to a sixth wall of the third vehicle foot well. The fifth and sixth side panels are joined at respective fifth and sixth lateral sides of the third central panel by respective curved transitions. The fifth and sixth side panels further are joined to each other, by a curved transition, at a third junction. A vertical height of the fifth side panel, as measured, at the third junction, from the upper surface of the third central panel to the top margin of the fifth side panel is substantially similar to the vertical height of the sixth side panel, as measured, at the third junction, from the upper surface of the third central panel to the top margin of the sixth side panel. A third reservoir is formed in the third central panel. A plurality of upstanding, hollow, elongate third baffles are formed in the third reservoir, each to have at least two ends remote from each other. The third baffles are adapted to elevate the shoe or foot of an occupant above fluid collected in the third reservoir. Any portion of the third reservoir is connected to a remote portion of the third reservoir by a path formed around ends of the third baffles. The third baffles have a thickness from the upper surface of the third central panel to an opposed lower surface thereof. Each of the third baffles has a width, in any lateral direction, of more than two times its thickness. Similarly, the fourth, passenger's side floor tray has a fourth central panel that substantially conforms to the floor of a fourth, passenger's side foot well of the second vehicle. The fourth vehicle foot well has a shape that is different from the third vehicle foot well. The fourth tray further has a seventh, upstanding, generally transversely disposed side panel that substantially conforms to a seventh wall of the fourth vehicle foot well, and an eighth, upstanding, generally longitudinally disposed side panel that substantially conforms to an eighth wall of the fourth vehicle foot well. The seventh and eighth side panels are joined at respective seventh and eighth lateral sides of the fourth central panel by respective curved transitions. The seventh and eighth side panels further are joined to each other, by a curved transition, at a fourth junction. A vertical height of the seventh side panel, as measured, at the fourth junction, from the upper surface of the fourth central panel to the top margin of the seventh side panel is substantially similar to the vertical height of the eighth side panel, as measured, at the fourth junction, from the upper surface of the fourth central panel to the top margin of the eighth side panel. A fourth reservoir is formed in the fourth central panel. A plurality of upstanding, hollow, elongate fourth baffles are formed in the fourth reservoir, each to have at least two ends remote from each other. The fourth baffles are adapted to elevate the shoe or foot of an occupant above fluid collected in the fourth reservoir. Any portion of the fourth reservoir is connected to a remote portion of the fourth reservoir by a path formed around ends of the fourth baffles. The fourth baffles each have a thickness from the upper surface of the fourth central panel to an opposed lower surface thereof. Each of the fourth baffles has a width, in any lateral direction, of more than two times its thickness.

BRIEF DESCRIPTION OF THE DRAWINGS

Further aspects of the invention and their advantages can be discerned in the following detailed description, in which like characters denote like parts and in which.

DETAILED DESCRIPTION

Figure 1:
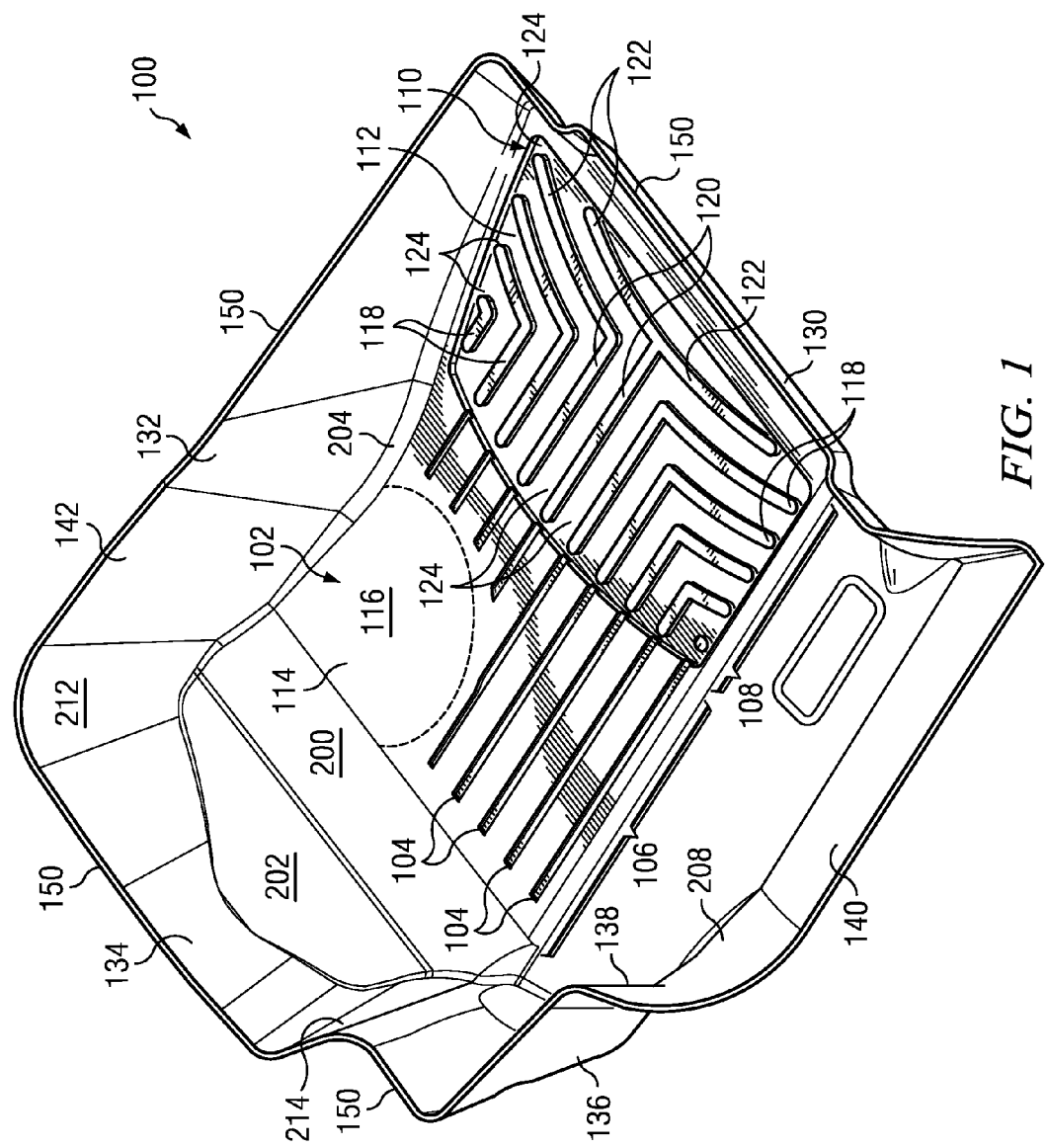
FIG. 1 is an isometric view of one embodiment of a vehicle floor tray according to the invention.

An isometric view of one commercial embodiment is shown in FIG. 1. The illustrated vehicle floor tray indicated generally at 100 is preferably molded from a blank, in sheet form, of water-impervious thermoplastic polymer material having a uniform thickness, although the present invention could be fabricated from another process such as injection molding. The floor tray 100 is preferably formed of a triextruded thermoplastic material such that the properties of a central or core layer can be different than the properties of the external or jacket layers, and such that the triextrusion is tougher and stiffer per unit thickness than any of the layers from which it is made, as will be described in more detail below.

The vehicle floor tray or cover 100 is meant to protect both the floor and at least the lower sides of a vehicle foot well, and thus takes on a much more three-dimensional shape than is typical of prior art floor mats. The floor tray 100 includes a floor or central panel 102, which in the illustrated embodiment includes a plurality of fore-to-aft or longitudinal parallel straight channels 104 that are disposed in a forward region 106 of the floor panel 102. Preferably these channels are about an eighth of an inch deep so that they will correctly channel runoff, and can be about one-quarter of an inch wide. In FIG. 1, forward is a direction to the upper left, while rearward is the direction to the lower right, and the terms are used in conformance with the orientation of the vehicle in which the tray is designed to be placed. As used herein, "longitudinal" means for-and-aft or along the axis of vehicle travel, while "transverse" means at a ninety degree angle to such an axis, or side-to-side.

A rearward or back region 108 of the floor panel 102 is largely occupied by a reservoir 110, whose bottom is made up by a substantially planar general surface 112. General surface 112 is situated to be below a general surface 114 of the forward region 106. Preferably, the general bottom reservoir surface 112 is also below the bottommost points of the respective channels 104, as by about one-eighth of an inch, so that fluid in the channels 104 will empty into the reservoir 110.

The channels 104 are designed to channel liquid runoff from the user's feet or footwear to the reservoir 110. In many vehicles, the portion of the vehicle floor (not shown in this Figure; see FIGS. 8-11) which underlies the forward region 106 slopes from front to rear, and thus the tray 100, by simply conforming to the contour of the underlying vehicle floor portion, will channel fluid to the reservoir. For those vehicle designs in which the underlying vehicle floor is not pitched in this manner, the tray 100 can advantageously be designed to create this fluid flow, as by making the material thicker in portion 106 than in portion 108, or by giving the bottoms of channels 104 a front-to-rear slope.

The channels 104 occupy most of the forward region 106, although in this and other commercial embodiments a space 116 on the forward right hand side has been left open to receive the foot of the driver that operates the accelerator and brake pedals. In the illustrated embodiment, this space or clear area 116 is a delimited by a 180 degree arc of a circle of about four inch radius (shown in dashed line). The clear area 116 is provided so that the relatively deep channels 104 do not catch the heel of the driver's shoe. In other embodiments, the clear area 116 can take other shapes or positions, so long as the heels of almost all drivers, while operating the brake and accelerator pedals of the vehicle for which the particular tray is designed, will rest within its confines.

The reservoir 110 has interspersed within it a plurality of tread surfaces or baffles 118, which have two purposes. The first purpose is to elevate the shoe or foot of the occupant above any fluid which may have collected in the reservoir 110. The second purpose is to prevent this accumulated fluid from sloshing around. To this end, most of the tread surfaces/baffles 118 have both fore-to-aft or longitudinal portions 120 and side-to-side or transverse portions 122. This prevents large fluid movement in a forward or rearward direction, as would otherwise happen during acceleration or braking of the vehicle, and also large fluid movement side-to-side, as when the vehicle is turning. Preferably, each or at least most of the fore-to-aft portions 120 are joined to respective side-to-side portions. This further compartmentalizes and restricts the movement of collected fluid. Fluid in one portion of the reservoir 110 may make its way only slowly and through a complicated path to another distant portion of the reservoir 110, through channels 124 around the ends of the treads or baffles 118. The reservoir design thus creates a large surface area which promotes evaporation of the fluid, while at the same time restricts fluid movement prior to such evaporation.

Disposed around the central or floor panel 102 are a series of upstanding side panels, which will vary in number and configuration from one vehicle model to the next. In the illustrated embodiment these upstanding panels include a back panel 130 that is disposed adjacent the bottom of a vehicle front seat, or a vehicle pedestal for receiving same; an inner side panel 132 that closely fits a transmission tunnel or "hump" in this vehicle; a forward panel 134 that closely conforms to a vehicle firewall; and an outer side panel 136. In most embodiments, the outer side panel or kick plate panel 136 will only extend from its transition with panel 134 to a corner 138, at which point there begins a door sill curve 208 which transitions into a door sill panel 140. Unlike the other panels, the sill panel 140 is not generally upstanding but instead conforms to the sill of a vehicle door and lies in a substantially horizontal plane. In this way occupant ingress and egress is not occluded. In many embodiments, including the illustrated embodiment, the sill panel 140 is at an elevation below that of the general surface 114 of the floor forward region 106 and even below the general surface (bottom) 112 of the reservoir 110. Very large amounts of fluid (in excess of the reservoir capacity) may therefore flow right out of the vehicle without having the opportunity to damage the vehicle interior. It should be noted that in these FIGUREs, the lines dividing the panels are conceptual only and do not appear in the final part. As will be described in further detail below, the tray 100 preferably is integrally molded as a one-piece construction.

In one important aspect of the invention, the tray 100 is closely fitted to the vehicle foot well in which it is designed to be placed. Panels 130, 132, 134, 136 and 140 are all formed so as to as closely conform to the vehicle surfaces against which they are positioned, to an extent not found in prior art vehicle floor trays. In a preferred embodiment, at least throughout the top one-third of the areas of these panels that is adjacent a vehicle tray top margin 150, at least ninety percent of the points on the outer surface of the peripheral or side panels 130-136 are no more than about one-eighth of an inch from the corresponding points on the surfaces that they are formed to mate with. This close conformance occurs even where the underlying vehicular surface is complexly curved or angled. Certain portions of the vehicle foot well surface, such as kick plate transition plate 214, can have both convexly and concavely curved elements. The preferred tolerance of door sill curve 208 and sill plate 140 is even tighter, about 0.025 in.

The close conformance of the tray side panels to respective surfaces of the vehicle foot well produces a protective tray which will not be horizontally displaced under lateral forces created by the occupant's feet, or by the motion of the vehicle. Opposing pairs of the peripheral panels "nest" or "cage" the tray 100, preventing its lateral movement. Thus, outer side panel or kick plate panel 136, which closely conforms to a vehicle side wall at that position, has as its counterpart a portion 142 of the inner side panel 132. Any tendency of the tray 100 to shift leftward is stopped by panel 136; any tendency of the tray 100 to shift rightward is stopped by panel portion 142. In a similar manner, the upstanding rearward and forward panels 130 and 134 cooperate to "cage" any forward or rearward motion of the tray 100 within the vehicle foot well.

The close conformance of the outer or lower surfaces of panels 130-136, 218, 140 to their respective mating surfaces of the vehicle foot well also increases the frictional force which will oppose any lateral movement. The result of this close conformance is to provide a floor tray which will not undesirably shift position, and which will provide a steady and sure rest to the feet of the occupants.

In most commercial embodiments of the vehicle floor tray 100, the side panels 130-136, 140 will not be formed to abruptly extend from the bottom panel 102, but rather will be joined to the bottom or central panel 102 through transitions. These transitions may be sloped or curved and will have a varying degree of gradualness. According to the invention, the transitions between the outer and bottom surfaces of the tray 100 conform wherever possible to underlying surfaces of the vehicle foot adjacent these transitions.

Figure 2:
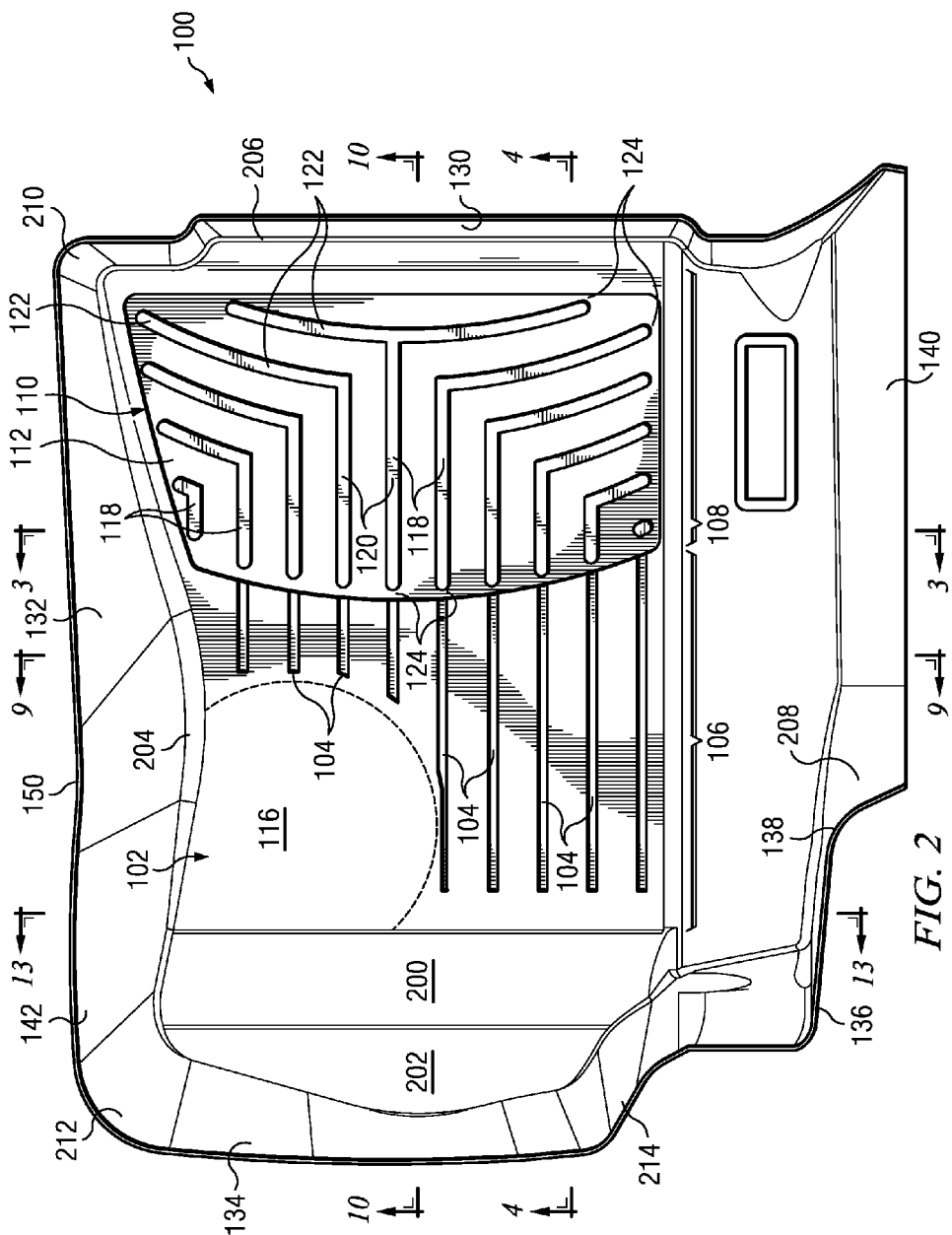
FIG. 2 is a top view of the floor tray illustrated in FIG. 1.

In FIG. 2, for example, there is seen a large transition or subpanel 200 which extends from forward portion 106. A further subpanel 202 joins transitional subpanel 202 to the forward sidewall 134. Inner or transmission tunnel sidewall 132 is joined to the pan 102 through a curved transitional fillet 204. The rear upstanding panel 130 is joined to the rear portion of bottom panel 102 through a small transition 206. A transition or sill curve 208 between the outer sidewall 136 and the sill panel 140 takes the form of a gradual curved surface.

The present invention also employs (typically) curved transitions between adjacent side panels. For example, a curved transition 210 joins the back panel 130 to the inner side panel 132. A curved transition 212 joins the transmission tunnel or inner side panel 132 to the front or firewall panel 134. A transition 214, which in this embodiment takes the shape of an S-curve and conforms to a portion of vehicle wheel well, joins the front panel 134 to the outer side panel 136. The close conformance (preferably to a tolerance of about ⅛ in.) wherever possible to the transitions of the vehicle foot well surface by the outer surface of the tray 100 enhances a close fit.

Figure 3:
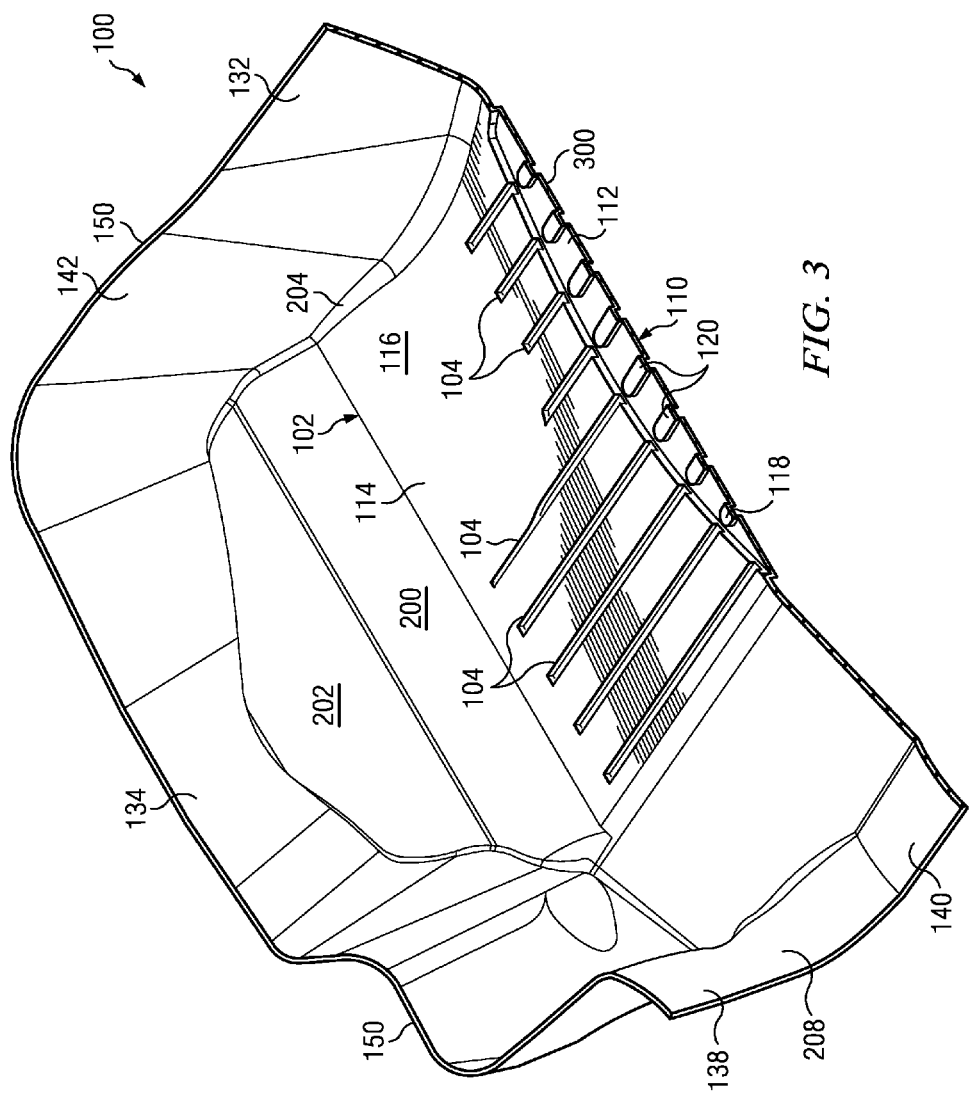
FIG. 3 is an isometric and transverse sectional view of the floor tray seen in FIGS. 1 and 2, the section taken substantially along line 3-3 of FIG. 2.
Figure 4:
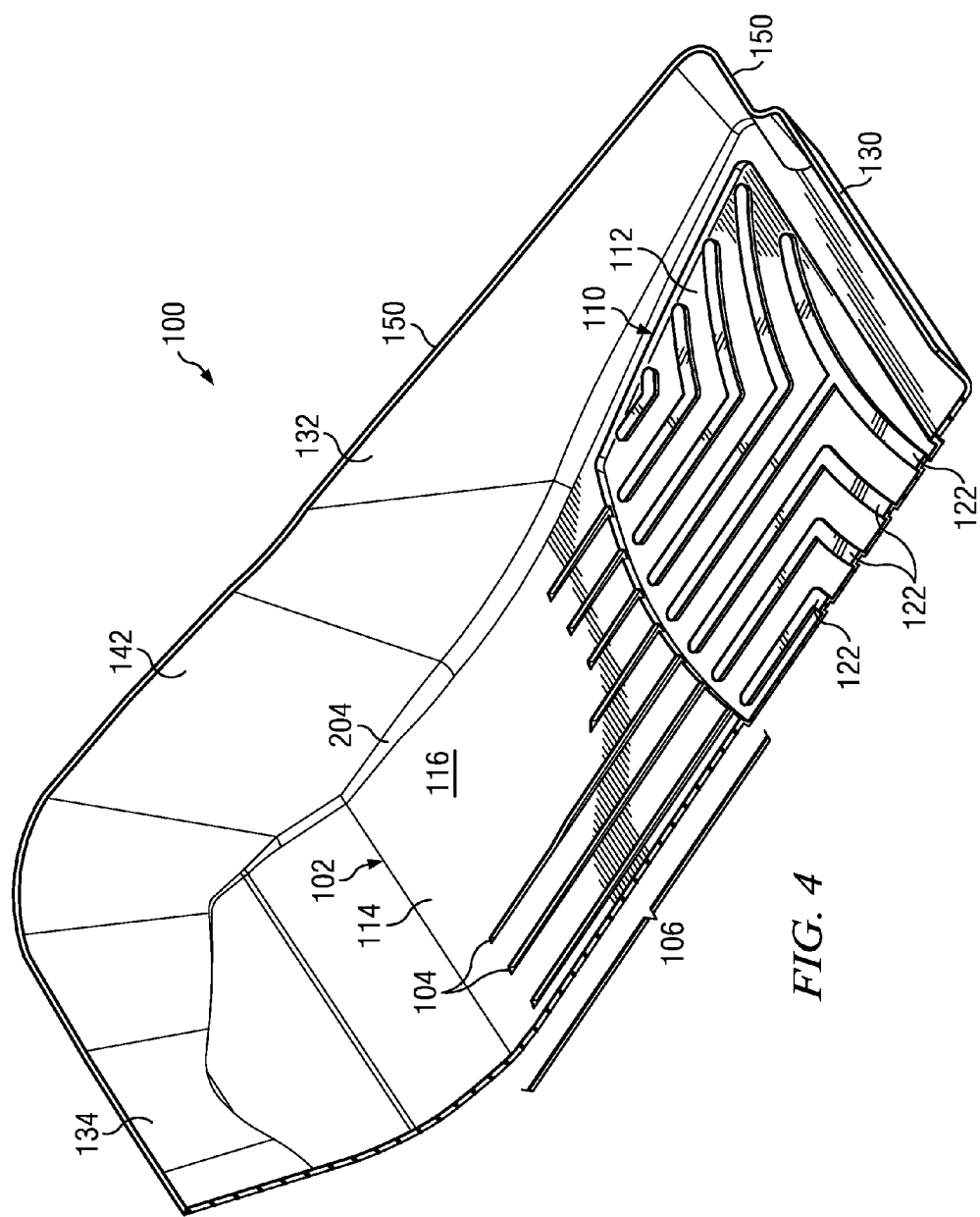
FIG. 4 is an isometric and longitudinal sectional view of the floor tray shown in FIGS. 1 and 2, the section taken substantially along line 4-4 of FIG. 2.

In the illustrated embodiment, the tray according to the invention has been made by placing a sheet of substantially uniformly thick triextruded thermoplastic material into a mold and heating the mold. When this process is used, discrete layers having different characteristics can persist into the final product, as will be described in more detail below. On the other hand, as using this manufacturing process it is difficult to provide the channels and reservoir structure according to one aspect of the invention while closely conforming the bottom surface 300 (FIGS. 3 and 4) to a mating surface of the vehicle foot well. In this central area, and according to the preferred manufacturing process, a departure away from ⅛ in. tolerance must be made in order to obtain the above-described benefits of fluid flow and retention. But because the side panels 130-136, 140 and their associated transitions continue to closely conform to most of the remaining vehicle foot well surfaces, the tray 100 continues to be locked in one place.

Figure 10:
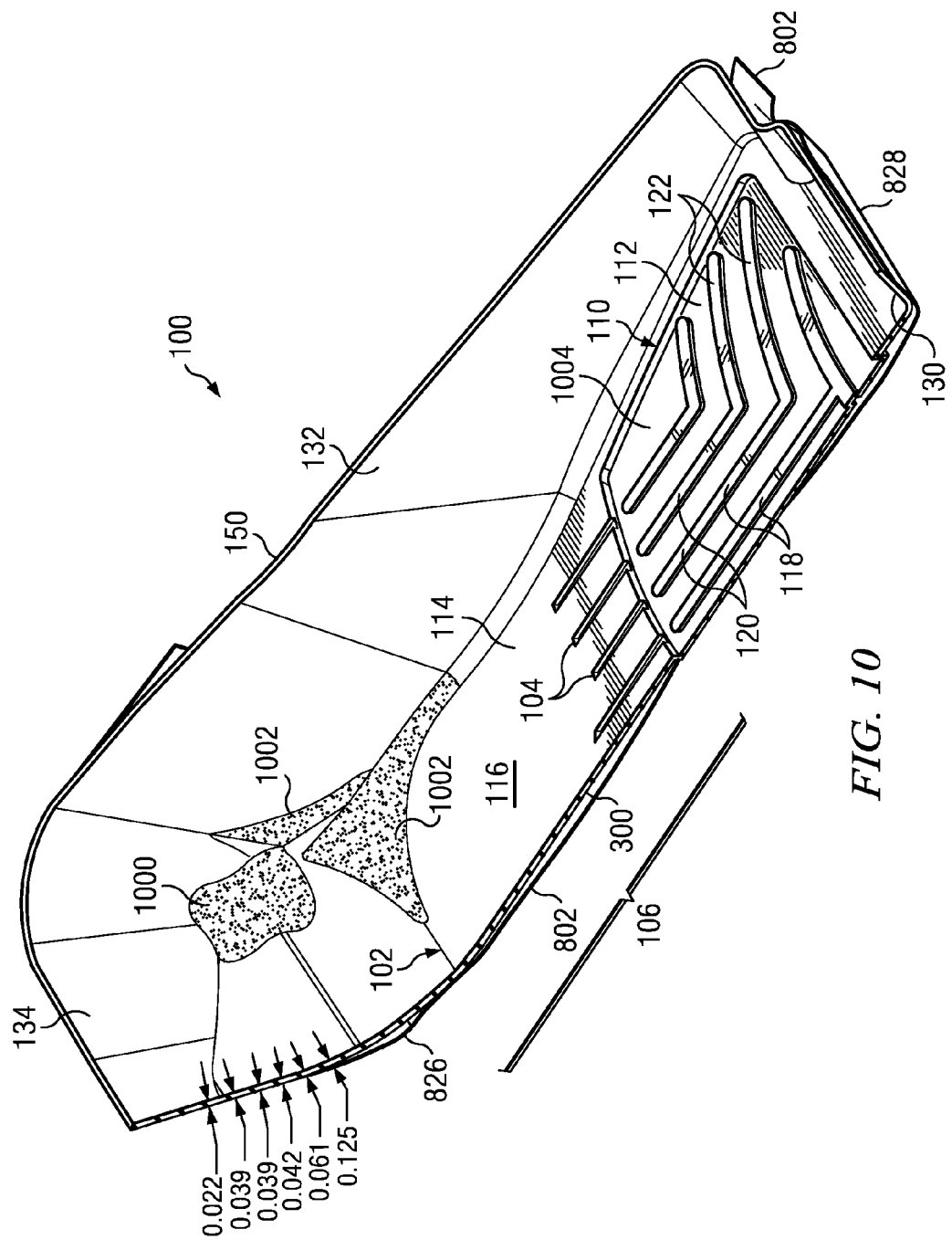
FIG. 10 is a partly transverse sectional, partly isometric view of both the floor tray illustrated in FIG. 2 and the vehicle foot well surface illustrated in FIG. 8, taken substantially along line 10-10 of FIG. 2 and substantially along line 10-10 of FIG. 8.
Figure 11:
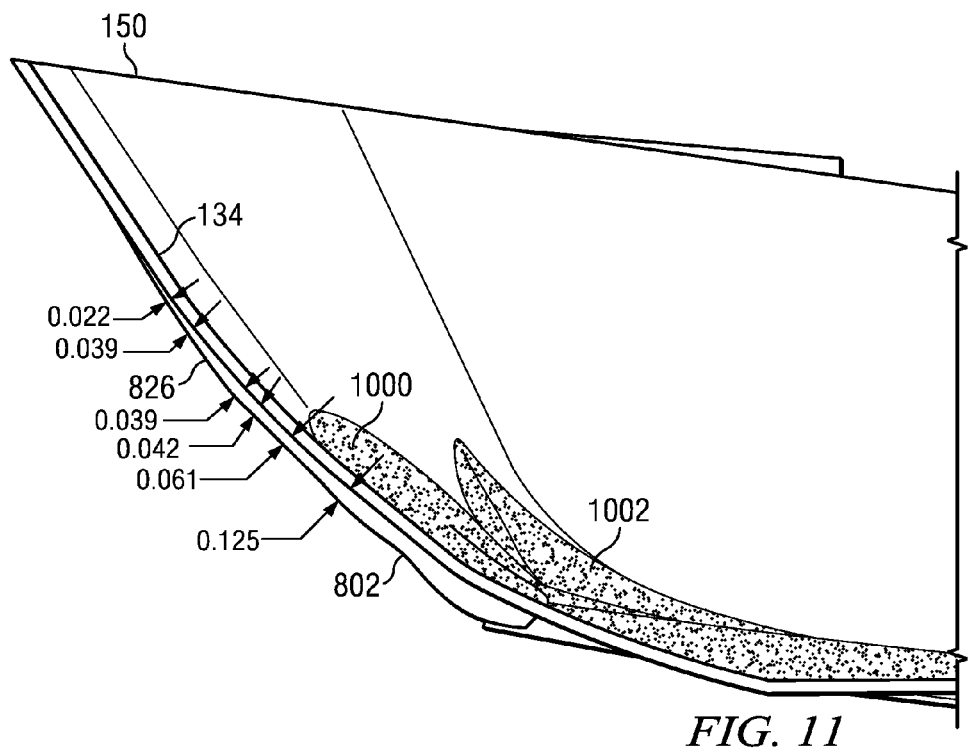
FIG. 11 is a detail of a firewall region of FIG. 10.

FIGS. 10-14 superimpose a floor tray 100 on a surface 802 of a vehicle foot well for which the tray is designed according to the invention. In the part-isometric, part-longitudinal sectional view seen in FIG. 10, it can be seen that on the section taken there is a quite tight conformance of the lower surface 300 of the tray 100 to the modeled surface 802 of the vehicle foot well. As best seen in FIG. 11, the outer surface of the firewall sidewall 134 stays within one-eighth of an inch of the firewall surface 826 for at least three-quarters of the length of surface 826 as measured from the top margin 150 of the tray. In areas 1000, 1002 and 1004 (FIG. 10), the modeled surface 802 of the vehicle foot well is actually above or to the interior to the tray 100. This negative interference is tolerable and in some instances is even desirable because the surface 802 is that of a vehicle carpet, which can or even should be depressed upon the installation of the tray 100 into the vehicle foot well. Such a tight fit is particularly desirable, for example, in the region of the tray around the accelerator pedal.

Figure 12:
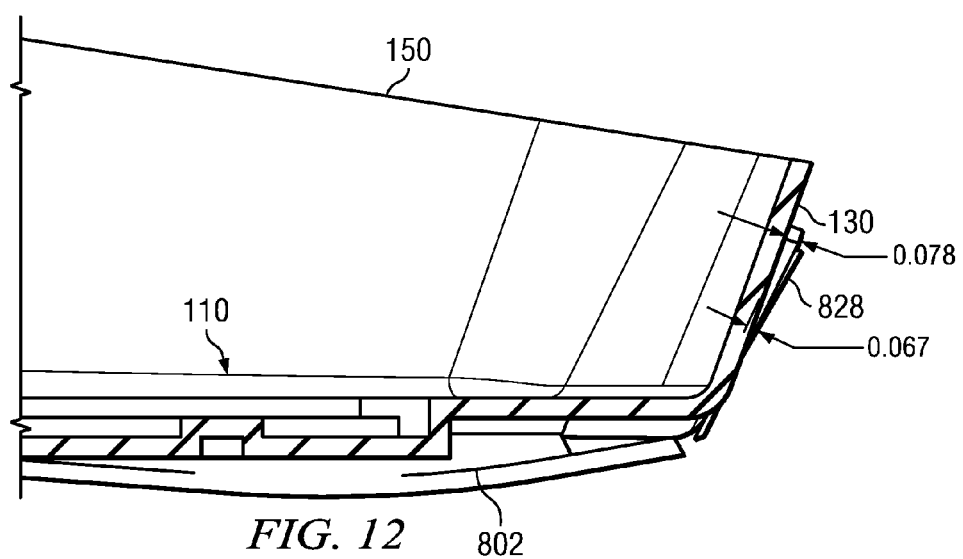
FIG. 12 is a detail of a seat pedestal region of FIG. 10.

FIG. 12 is a detail of FIG. 10 in the area of the seat pedestal and a portion of the reservoir 110. Once again, there is a very tight conformance of the outer surface of the back panel 130 to the modeled seat pedestal surface 828 throughout most of its length on this section, well within ⅛ inch.

Figure 13:
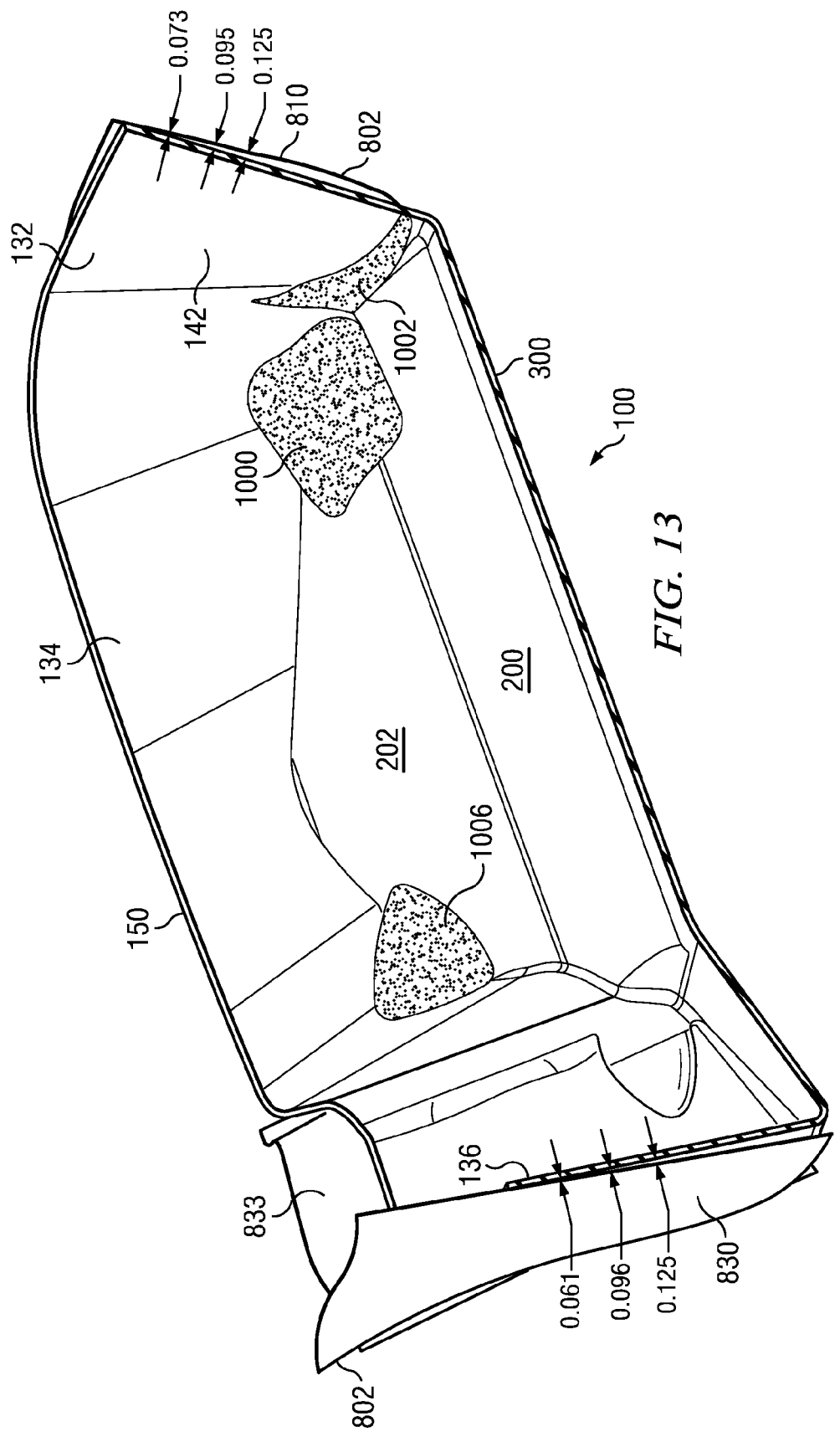
FIG. 13 is a partly longitudinal sectional, partly isometric view of both the floor tray illustrated in FIG. 2 and the vehicle foot well surface illustrated in FIG. 8, taken substantially along line 13-13 of FIG. 2 and substantially along line 13-13 of FIG. 8.

FIG. 13 shows a side-to-side or transverse section taken in a relatively forward location, so as to cut through the kick plate tray and foot well surfaces 136, 830 on one side and the tray and foot well transmission tunnel surfaces 132, 810 on the other. As can be seen, tolerance to within ⅛ of an inch is maintained at least for the upper one-third of the surface area of these mating surfaces. Areas 1000, 1002 (partially represented in FIG. 13) and 1006 are areas of negative standoff or interference in which the modeled surface 802 of the vehicle foot well is positioned interiorly of the vehicle tray 100. As above explained, this mismatch is permissible if held to ⅛ inch or less, and is even desirable in some points, because the surface 802 is an image of vehicle carpeting rather than a hard surface.

Figure 14:
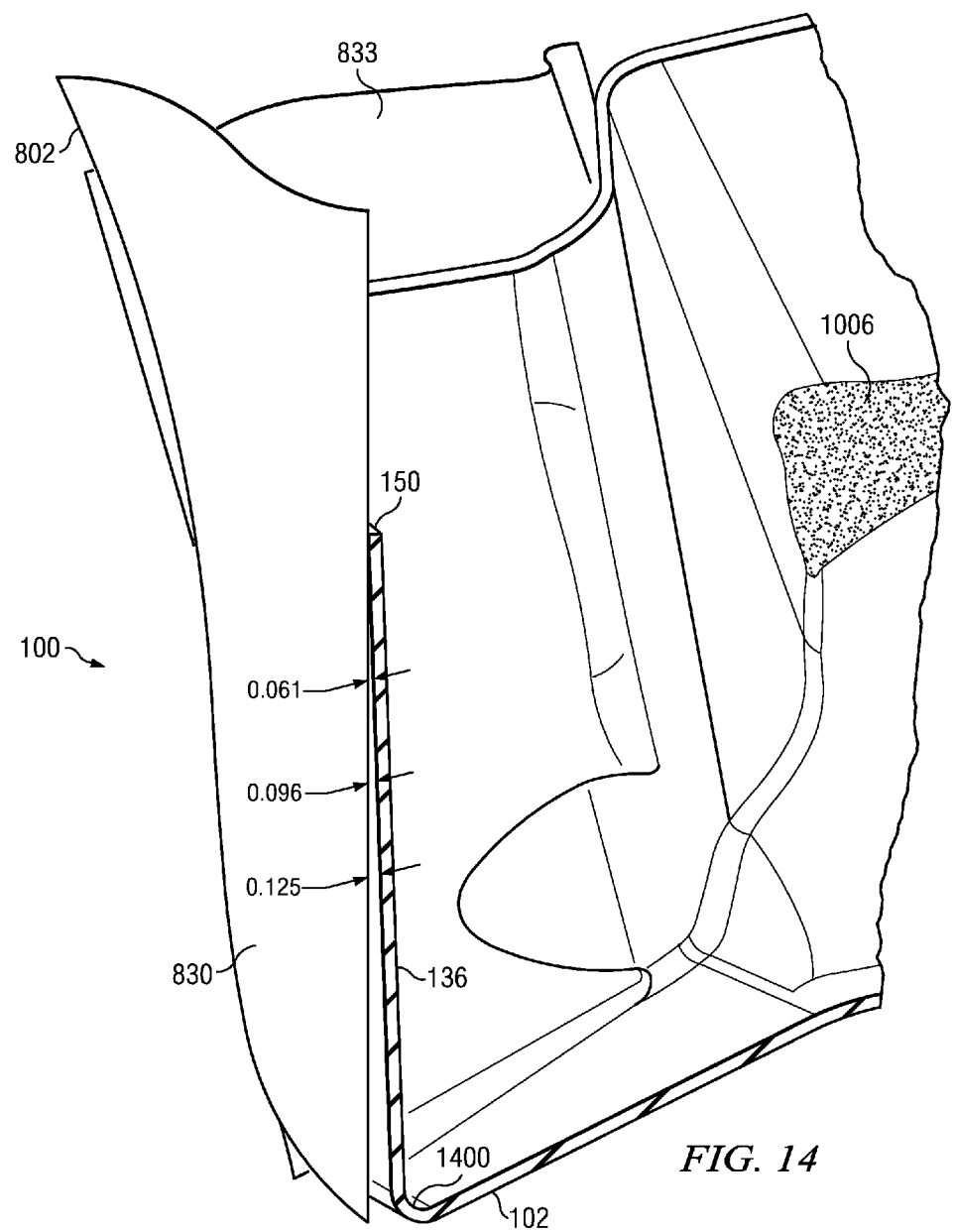
FIG. 14 is a detail of a kick plate region of FIG. 13.

In FIG. 14, there is seen at 1400 an intentional increase of radius of the transition between kick plate panel 136 and bottom wall 102. This is done because, for the model shown, the foot well kick plate surface 830 is both vertical and is relatively deep. Therefore, sidewall 136 needs to have a draft of at least two degrees (and more preferably five degrees) relative to the surface 830 to insure that the wall of the tray 100 will remain acceptably thick enough at the junction of walls 136, 102. The increase of the radius 1400 accomplishes this. Nonetheless, even on this section the outer surface of the kick plate 136 stays within one-eighth of an inch of the kick plate surface 830 for at least one-third of the length, as measured from margin 150.

More generally, at least ninety percent of that top one-third of the surface area of each sidewall 130-136 that is adjacent the top margin 150 stays within ⅛ in. of the vehicle foot well surfaces with which they are designed to mate. Alternatively, ninety percent of the top one-half of the outer surface area of all upstanding sidewalls is within this ⅛ inch tolerance of respective foot well surfaces. In even a further alternative measurement of tolerance, it is preferred that at least fifty percent of the outer area of the upstanding sidewalls 130-136 be within ⅛ inch of the vehicle foot wells to which they correspond, regardless of position relative to the top margin 150.

Figure 5:
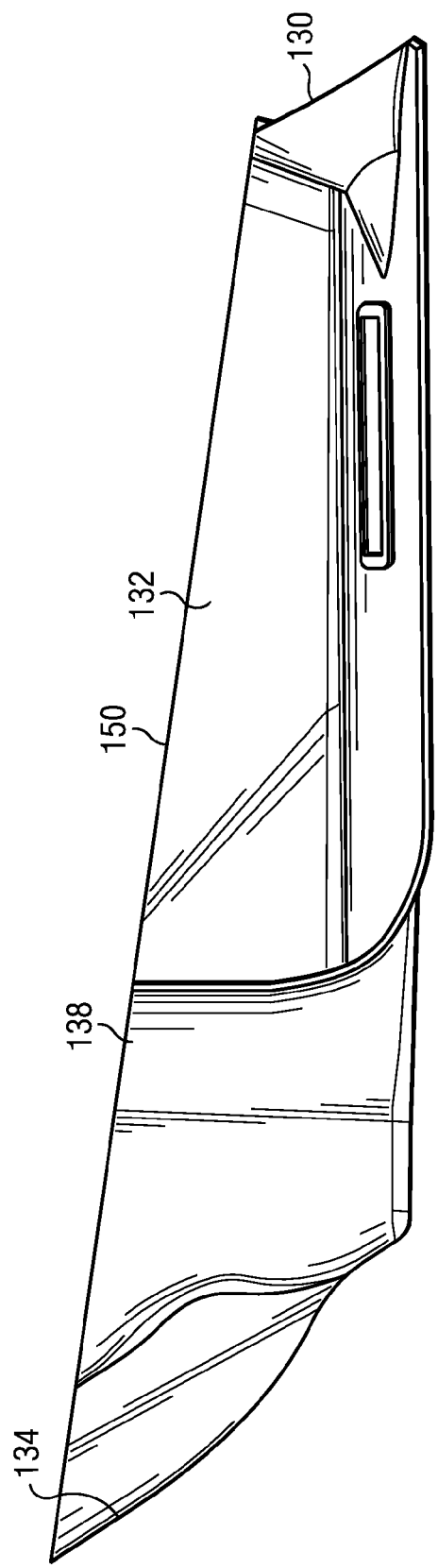
FIG. 5 is a side view of the tray illustrated in FIG. 1, taken from the outer side.

As best seen in FIGS. 1, 5 and 10, a top margin 150 of the tray 100, which terminates all of the upstanding sidewalls 130, 132, 134, 136 and 138, substantially lies in a single plane which is tilted forwardly upwardly relative to the horizontal plane. The continuous nature of the top margin 150 means that the produced tray 100 has a higher hoop strength, and better protects the vehicle carpeting from dirt or mud on the sides of the occupant's feet. The occupant's feet tend to occupy positions on the forward region 106, but the position of the top margin 150 around this region is high, being at least five inches removed from the floor of the tray at its greatest separation.

COMPOSITION

Figure 6:
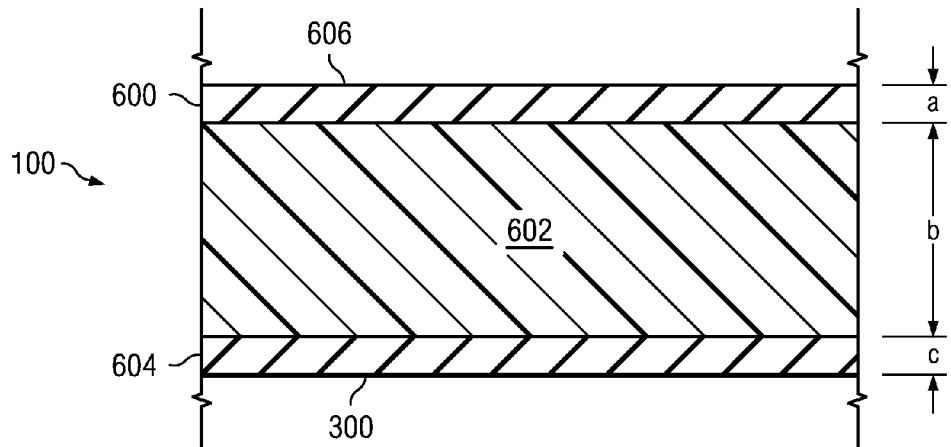
FIG. 6 is a highly magnified sectional view of a vehicle floor tray, showing triextruded layers.

According to one aspect of the invention, it is preferred that the tray or cover 100 not be of uniform composition throughout, but rather be a laminate having at least three layers which are bonded together. A preferred composition of the tray 100 is shown in the highly magnified sectional detail shown in FIG. 6. In this illustrated embodiment, the tray 100 consists of a top layer 600, a central or core layer 602, and a bottom layer 604. All three layers 600-604 preferably consist of one or more water-impervious thermoplastic polymers, but layers 600 and 604 have properties which are at least different from core layer 602 and may even have properties which are different from each other. The trilayer cover is shown to be a three-dimensional floor tray in the drawings, but can also be a more two-dimensional floor mat of more limited coverage. Top layer 600 is made from a material selected for its tactile properties, its relatively high static and dynamic coefficients of friction with respect to typical footwear, and its resistance to chemical attack from road salt and other substances into which it may come into contact. Top layer 600 preferably includes a major portion of a thermoplastic elastomer such as VYRAM®, SANTOPRENE® or GEOLAST®, which are proprietary compositions available from Advanced Elastomer Systems. VYRAM® is preferred, particularly Grade 101-75 (indicating a Shore A hardness of 75). An upper surface 606 of the top layer 600 may be textured by a "haircell" pattern or the like so as to provide a pleasing tactile feel and visual appearance, as may a lower surface of the bottom layer 604.

It is preferred that top layer 600 be a polymer blend, in which instance a minor portion of the composition of the top layer 600 is selected for its coextrusion compatibility with core layer 602. A polyolefin polymer is preferred, such as polypropylene or more preferably polyethylene, even more particularly a high molecular weight polyethylene (HMPE). As used herein, HMPE is a commodity product, available from many sources, and distinguished in the industry from low density polyethylene (LDPE) and high density polyethylene (HDPE) by its approximate properties:

| Characteristic | LDPE | HDPE | HMPE |
| --- | --- | --- | --- |
| Specific Gravity, ASTM D-792 | 0.918 | 0.96 | 0.95 |
| Tensile Modulus, ASTM D-638, psi | 22,500 | 95,000 | 125,000 |
| Tensile Strength @ Yield, ASTM D-638, psi | 1,800 | 4,500 | 3,600-3,700 |
| Flexural Modulus, ASTM D-790, psi | | 225,000 | 165,000-175,000 |
| Hardness, ASTM D-2240, Shore D | 45 | 66 | 68 |

In the above table, the testing methods by which the properties are determined are given for the purpose of reproducibility.

Particularly where the thermoplastic elastomer and the polyolefin are respectively selected as VYRAM® and HMPE, the proportion by weight of the thermoplastic elastomer to polyolefin material in layer 600 is preferably selected to be about 3:1. It has been discovered that some polyolefin material needs to be present in layer 600 for coextrusion compatibility with central layer 602, in the instance where a major portion of the layer 602 is also a polyolefin.

In an alternative embodiment, the thermoplastic elastomer component of the top layer 600 may be replaced with an elastomer such as natural rubber, acryl-nitrile butadiene rubber (NBR), styrene butadiene rubber (SBR), or ethylene propylene diene rubber (EPDM).

In a further alternative embodiment, layer 600 can be an acrylonitrile butadiene styrene (ABS) blend. ABS is a material in which submicroscopic particles of polybutadiene are dispersed in a phase of styrene acrylonitrile (SAN) copolymer. For layer 600, the percentage by weight of polybutadiene, which lends elastomeric properties to the material, should be chosen as relatively high.

The core or central layer 602 preferably is composed of a thermoplastic polymer material that is selected for its toughness, stiffness and inexpensiveness rather than its tactile or frictional properties. Preferably a major portion of it is a polyolefin such as polypropylene or polyethylene. More preferably, a major portion of the layer 602 is composed of HMPE as that material has been defined above.

It is preferred that the central layer 602 be a blend, and in that instance a minor portion of layer 602 is composed of a material selected for its coextrusion compatibility with top layer 600 (and bottom layer 604 described below). In the illustrated embodiment, this minor portion is a thermoplastic elastomer such as SANTOPRENE®, GEOLAST® or VYRAM®. VYRAM® Grade 101-75 is particularly preferred. For layer 602, and particularly where the polyolefin and the thermoplastic elastomer are respectively selected as HMPE and VYRAM®, the proportion by weight of polyolefin to thermoplastic elastomer is preferred to be about 3:1. More generally, the percentages of the minor portions in layers 600 and 602 (and layer 604) are selected as being the minimum necessary for good coextrusion compatibility.

In an alternative embodiment, where layer 600 has been chosen as a polybutadiene-rich layer of ABS, layer 602 is chosen as a grade of ABS having less of a percentage by weight of polybutadiene in it, or none at all (effectively, styrene acrylonitrile copolymer or SAN).

Bottom layer 604 has a lower surface 300 which will be adjacent the vehicle foot well top surface. Typically, this surface is carpeted. The bottom layer 604 is a thermoplastic polymer material selected for its wear characteristics, as well as its sound-deadening qualities and a yieldability that allows the layer 604 to better grip "hard points" in the vehicle foot well surface as well as conform to foot well surface irregularities. Preferably, a major portion of the layer 604 is composed of a thermoplastic elastomer, such as SANTOPRENE®, GEOLAST® or, preferably, VYRAM®. VYRAM® Grade 101-75 is particularly preferred.

It is preferred that the bottom layer 604 be a polymer blend. In this instance, a minor portion of the bottom layer 604 is selected for its coextrusion compatibility with the core layer 602. Where core layer 602 is mostly made of a polyolefin material, it is preferred that a polyolefin be used as the minor portion of the bottom layer 604. This polyolefin can be, for example, polypropylene or polyethylene, and preferably is HMPE. The amount of the minor portion is selected to be that minimum amount that assures good coextrusion compatibility. Where the polyolefin and the thermoplastic elastomer are respectively chosen to be HMPE and VYRAM®, it has been found that the thermoplastic elastomer:polyolefin ratio by weight in the layer 604 should be about 3:1.

In an alternative embodiment, the thermoplastic elastomer component of layer 604 may be replaced with a rubber, such as natural rubber, NBR, SBR or EPDM.

In another alternative embodiment, where the central layer 602 has been selected as ABS or SAN, layer 604 can be selected as a grade of ABS which has a higher percentage by weight of polybutadiene in it than in central layer 602.

Bottom jacketing layer 604 conveniently can have the same composition as top jacketing layer 600, but the two jacketing layers do not have to be similar. What is important that, where the tray 100 is to be formed as a triextrusion (as is preferred), layers 600, 602 and 604 be sufficiently compatible that they can be triextruded as a single sheet.

It is preferred that most of the thickness of the tray 100 be made up by the core layer 602, which is used as the principal structural component of the tray 100. The core layer 602 has at least minimally acceptable tensile strength, shear strength and high flexural modulus, while at the same time being significantly less expensive than the thermoplastic elastomer-dominated jacketing layers. The jacketing layers 600 and 604 are selected to present good wear surfaces and to have a good resistance to chemical attack from substances such as road salt. Top layer 600 is selected to exhibit a relatively high coefficient of friction with respect to typical occupant footwear. The composition of bottom layer 604 is selected for its sound-deadening and yieldability qualities.

The total thickness of tray 100 is the sum of dimensions a, b and c. In the illustrated embodiment, jacketing layer thicknesses a and c are each about 12.5% of the total thickness, while core layer thickness b is about 75%. In one embodiment, the total thickness of the tray 100 (or, more precisely, of the blank sheet used to mold the tray 100) is approximately 0.120 inch. Of this, core layer 602 is about 0.09 inch, while jacketing layers 600 and 604 are each about 0.0150 inch. In an alternative embodiment, the layer 600 can be made to be appreciably thicker than layer 604, as top surface 606 is a wear surface for the shoes of the occupant and will see more abrasive dirt and more wear than surface 300 in typical applications. In another alternative embodiment, the thickness of layer 604 may be increased, allowing it to even better conform to the vehicle foot well surface with which it is designed to mate and to increase sound-deadening.

A preferred embodiment of the present invention combines the high coefficient of friction, tactile qualities, sound-deadening and yieldability obtainable with a thermoplastic elastomer with the modest cost of a polyolefin. To demonstrate the technical advantages of a triextrusion tray over monoextruded prior art structures, tests measuring tensile strength, shear strength, flexural modulus and coefficient of friction were performed on (1) a triextrusion sheet material made and used according to the invention, (2) a monoextruded sheet of 75 wt. pct. VYRAM®/25 wt. pct. HMPE, and (3) a monoextruded sheet of wt. pct. VYRAM®/75 wt. pct. HMPE. The particular tests and their results are described below.

The first two tests performed concern static and dynamic coefficients of friction.

Example 1

These tests determined static and kinetic coefficients of friction of a sheet of triextrusion material with respect to an object meant to emulate a typical occupant shoe outsole. This "shoe" was composed of Shore A Durometer 60 neoprene rubber, formed as a "sled" measuring 2.5 in.×2.5 in.×0.238 in. The "shoes" were drawn across an upper, textured surface of a 0.120 in. triextrusion sheet formed according to a preferred embodiment of the invention measuring 4 in.×12 in. according to the procedure set forth in ASTM D 1894-01. The triextrusion sheet had, as its top layer, a blend of 75 wt. pct. VYRAM® Grade 101-75/25 wt. pct. HMPE. The core layer was 75 wt. pct. HMPE/25 wt. pct. VYRAM® Grade 101-75. The bottom layer was a blend of 25 wt. pct. HMPE/75 wt. pct. VYRAM® Grade 101-75. The bottom and top layers each comprised about 12.5% of the sheet thickness while the middle core layer comprised about 75% of the sheet thickness. Results are tabulated as follows.

| Test Number | Static Load (g) | Sled Weight (g) | Static Coefficient of Friction | Kinetic Load (g) | Sled Weight (g) | Kinetic Coefficient of Friction |
|---|---|---|---|---|---|---|
| 1 | 166 | 199.9 | 0.830 | 189 | 199.9 | 0.945 |
| 2 | 155 | 199.9 | 0.775 | 166 | 199.9 | 0.830 |
| 3 | 171 | 200.0 | 0.855 | 179 | 200.0 | 0.895 |
| 4 | 145 | 199.9 | 0.725 | 160 | 199.9 | 0.800 |
| 5 | 150 | 199.9 | 0.750 | 163 | 199.9 | 0.815 |
| Average | | | 0.787 | | | 0.857 |
| Std. Dev. | | | 0.054 | | | 0.061 |

Example 2

Five neoprene rubber "sleds" fabricated as above were drawn across a 4 in.×12 in. sheet of a single-extrusion 75 wt. pct. HMPE/25 wt. pct. VYRAM® Grade 101-75, according to ASTM D 1894-01. Results are tabulated below.

| Test Number | Static Load (g) | Sled Weight (g) | Static Coefficient of Friction | Kinetic Load (g) | Sled Weight (g) | Kinetic Coefficient of Friction |
|---|---|---|---|---|---|---|
| 1 | 157 | 200.1 | 0.785 | 162 | 200.1 | 0.810 |
| 2 | 151 | 200.0 | 0.755 | 148 | 200.0 | 0.740 |
| 3 | 163 | 200.1 | 0.815 | 170 | 200.0 | 0.850 |
| 4 | 146 | 200.1 | 0.730 | 148 | 200.1 | 0.740 |
| 5 | 154 | 200.1 | 0.770 | 155 | 200.1 | 0.775 |
| Average | | | 0.771 | | | 0.783 |
| Std. Dev. | | | 0.032 | | | 0.047 |

The above tests show that with respect to a typical shoe sole composition, a material consisting mostly of a thermoplastic elastomer like VYRAM® exhibits a higher coefficient of friction than a material consisting mostly of a high molecular weight polyolefin.

Example 3

These tests compared the tensile strength of a sheet of triextruded material as above described with a sheet of single-extruded blend of material consisting of 75 wt. pct. VYRAM®, Grade 101-75, and 25 wt. pct. HMPE, and further with a sheet of a single-extruded blend of material of 75 wt. pct. HMPE and 25 wt. pct. VYRAM® Grade 101-75. The tested single-extruded VYRAM®-dominated sheet was approximately 0.070 in. thick, while the HMPE-dominated sheet was approximately 0.137 in. thick. The triextrusion sheet was about 0.120 in. thick. The triextrusion sheet, the single-extruded VYRAM®-dominated sheet and the single-extruded HMPE-dominated sheet were die-cut into samples having an average width of 0.250". The test performed was according to the ASTM D 638-03 testing standard. A crosshead speed of 20 in./min. was used. The extensiometer was set at 1000% based on 1.0" gauge length. Samples were conditioned at 40 hours at 23 Celsius and 50% relative humidity prior to testing at these conditions. Test results are tabulated below.

| | Test Number | Tensile Strength at Yield (psi) | Elongation at Yield (%) | Tensile Stress at Break (psi) | Elongation at Break (%) | Tensile Modulus (Youngs) (psi) |
|---|---|---|---|---|---|---|
| Tri-Extrusion | 1 | 1680 | 24 | 1530 | 730 | 30800 |
| | 2 | 1710 | 21 | 1610 | 710 | 30100 |
| | 3 | 1700 | 21 | 1620 | 730 | 32200 |
| | 4 | 1740 | 19 | 1660 | 770 | 32700 |
| | 5 | 1690 | 17 | 1630 | 700 | 24400 |
| | Average | 1700 | 20 | 1610 | 730 | 30000 |
| | Std. Dev. | 23 | 3 | 48 | 27 | 3320 |
| 75% Vyram/ 25% HMPE | 1 | 1040 | 53 | 1400 | 620 | 15900 |
| | 2 | 1010 | 45 | 1430 | 630 | 17100 |
| | 3 | 1050 | 98 | 1390 | 640 | 17100 |
| | 4 | 1010 | 62 | 1430 | 620 | 16700 |
| | 5 | 1030 | 88 | 1420 | 610 | 17100 |
| | Average | 1030 | 69 | 1410 | 620 | 16800 |
| | Std. Dev. | 18 | 23 | 18 | 11 | 522 |
| 75% HMPE/ 25% Vyram | 1 | 919 | 63 | 1130 | 630 | 30200 |
| | 2 | 914 | 61 | 1110 | 630 | 34100 |
| | 3 | 925 | 69 | 1120 | 650 | 29500 |
| | 4 | 910 | 67 | 1110 | 650 | 21500 |
| | 5 | 912 | 68 | 1140 | 700 | 24000 |
| | Average | 916 | 66 | 1120 | 650 | 27900 |
| | Std. Dev. | 6 | 3 | 13 | 29 | 5060 |

The above data demonstrate that a triextrusion material according to the invention exhibits markedly greater tensile strength than a thermoplastic elastomer-dominated single-extrusion material. Also of interest is that the three-layer laminate exhibited a higher strength at yield and stress at break than the HMPE-dominated material, while showing a comparable tensile Young's modulus.

Example 4

Tests were performed on the above three materials for shear strength according to Test Standard ASTM D732-02. In these tests, a 1.00 in. dia. punch was applied to a 2.0 inch square of material until shear was achieved. The crosshead moved at 0.05 in/min. The test samples were preconditioned for at least 40 hours at 23 Celsius and 50% relative humidity, which were the conditions under which the tests were performed. Test results are tabulated below.

| Sample Name | Test Number | Thickness (in.) | Shear Force (lbf) | Shear Strength (psi) |
|---|---|---|---|---|
| Tri-Extrusion | 1 | 0.119 | 747 | 2000 |
|  | 2 | 0.122 | 783 | 2040 |
|  | 3 | 0.119 | 747 | 2000 |
|  | 4 | 0.121 | 757 | 1990 |
|  | 5 | 0.117 | 734 | 2000 |
|  | Average |  | 754 | 2010 |
|  | Std. Dev. |  | 18 | 19 |
| 75% VYRAM/ 25% HMPE | 1 | 0.072 | 423 | 1870 |
|  | 2 | 0.070 | 416 | 1890 |
|  | 3 | 0.073 | 489 | 2130 |
|  | 4 | 0.072 | 481 | 2130 |
|  | 5 | 0.073 | 455 | 1980 |
|  | Average |  | 453 | 2000 |
|  | Std. Dev. |  | 33 | 126 |
| 75% HMPE/ 25% VYRAM | 1 | 0.135 | 680 | 1600 |
|  | 2 | 0.137 | 688 | 1600 |
|  | 3 | 0.134 | 687 | 1630 |
|  | 4 | 0.136 | 724 | 1690 |
|  | 5 | 0.137 | 687 | 1600 |
|  | Average |  | 693 | 1620 |
|  | Std. Dev. |  | 18 | 39 |

The above test data show that, as normalized for the different thicknesses tested, the triextrusion material is similar in shear strength to the 75% VYRAM/25% HMPE single-extrusion blend, and superior in shear strength to the 75% HMPE/25% VYRAM® single-extrusion blend.

Example 5

Tests were performed to determine the flexural properties of samples of a tri-extrusion material of the above-described formulation, a 75 wt. pct. Vyram/25 wt. pct. HMPE material, and a 75 wt. pct. HMPE/25 wt. pct. VYRAM material (in all tests. the thermoplastic elastomer used was VYRAM® Grade 101-75). The tests were performed according to the ASTM D790-03 test method, Method I, Procedure A. For the tri-extrusion the dimensions of the samples averaged 0.490"× 0.0119"×5.00", the span length was 1.904 in., and the cross-head speed was 0.051 in./min. For the 75% Vyram/25% HMPE material, the dimensions of the samples averaged 0.484"×0.072"×5.00", the span length was 1.152 in., and the cross-head speed was 0.031 in./min. For the 75% HMPE/25% Vyram material, the dimensions of the samples averaged 0.50"×0.138"×5.00", the span length was 2.208 in., and the cross-head speed was 0.059 in/min. In all tests, the span-to-depth ratio was 16+/−1:1, the radius of the supports was 0.197 in., and the radius of the loading nose was 0.197 in. The tests were performed at 23 Celsius and 50% relative humidity and the samples conditioned for 40 hours at this temperature and humidity before the tests were performed. Results are tabulated below.

| Sample Name | Test Number | Flexural Stress At 5% Deflection (psi) | Flexural Modulus (tangent*)(psi) |
|---|---|---|---|
| Triextrusion | 1 | 294 | 33400 |
|  | 2 | 317 | 36000 |
|  | 3 | 304 | 33500 |
|  | 4 | 318 | 35700 |
|  | 5 | 305 | 33200 |
|  | Average | 308 | 34400 |
|  | Std. Dev. |  |  |
| 75% Vyram/ 25% HMPE | 1 | 234 | 15400 |
|  | 2 | 238 | 16400 |
|  | 3 | 230 | 14500 |
|  | 4 | 225 | 14300 |
|  | 5 | 228 | 14300 |
|  | Average | 231 | 15000 |
|  | Std. Dev. | 5 | 915 |
| 75% HMPE/ 25% Vyram | 1 | 508 | 13000 |
|  | 2 | 505 | 13800 |
|  | 3 | 496 | 13100 |
|  | 4 | 497 | 12900 |
|  | 5 | 518 | 13800 |
|  | Average | 505 | 13300 |
|  | Std. Dev. | 9 | 444 |

The asterisk in the table indicates that the reported values were arrived at by computer generated curve fit. These data show that the triextrusion is significantly stiffer than either monoextruded sheet. Overall, the triextrusion demonstrates superior properties in terms of tensile strength, shear strength and stiffness per unit cross-sectional area in comparison with that of any of the layers of materials from which the laminate is made, demonstrating that a triextruded tray or mat will be tougher and stiffer than one made of either monoextruded blend by itself.

PROCESS

Figure 7:
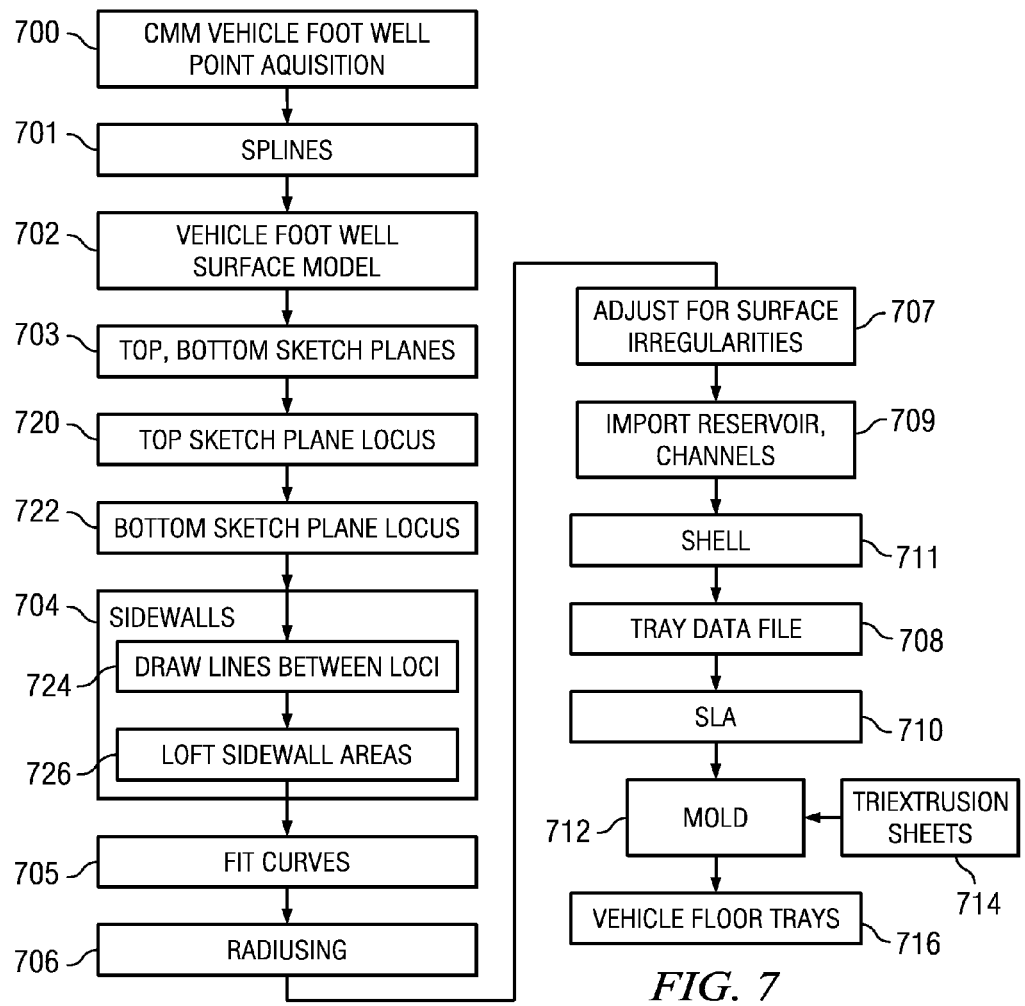
FIG. 7 is a schematic block diagram showing steps in a design and manufacturing process according to the invention.
Figure 8:
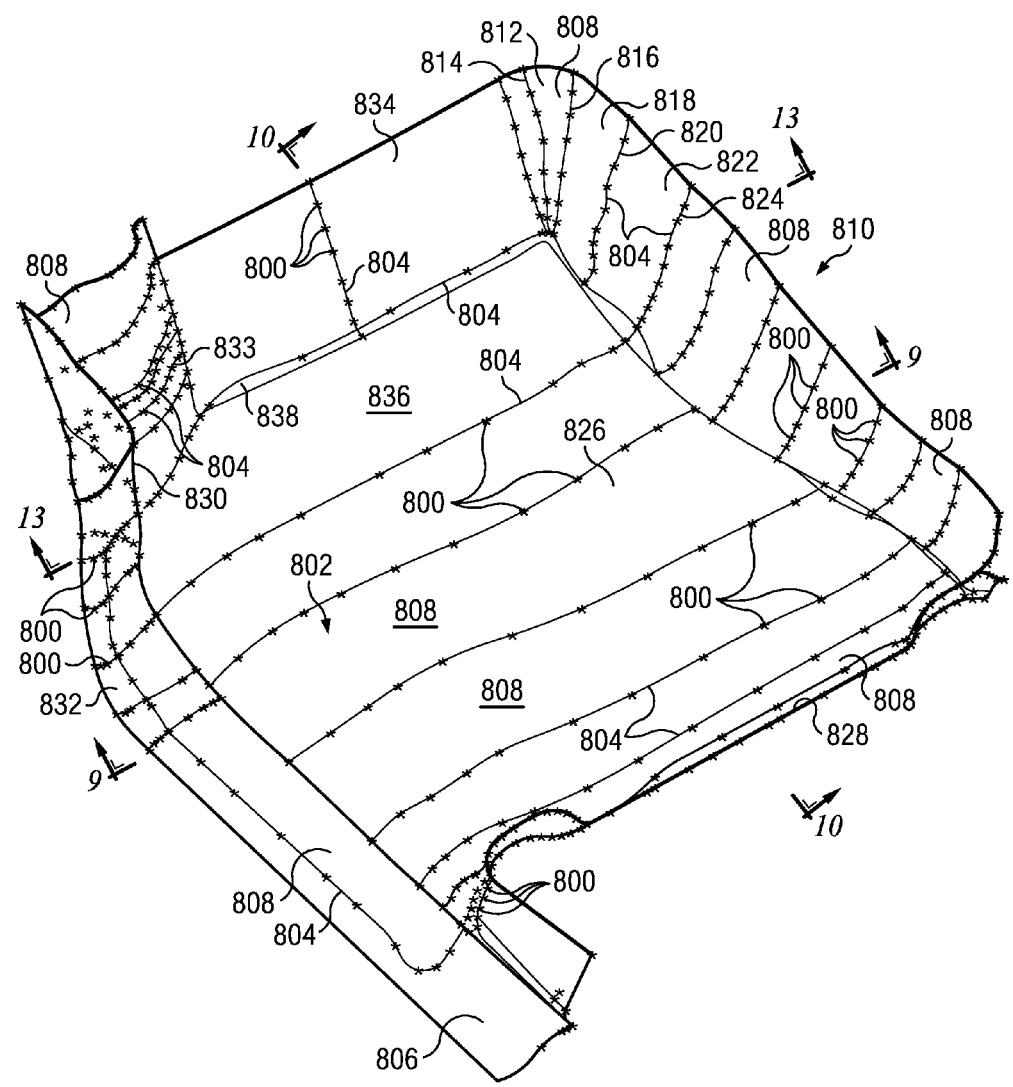
FIG. 8 is an isometric and schematic view of a digitally acquired vehicle foot well floor surface from which the illustrated floor tray was made.
Figure 9:
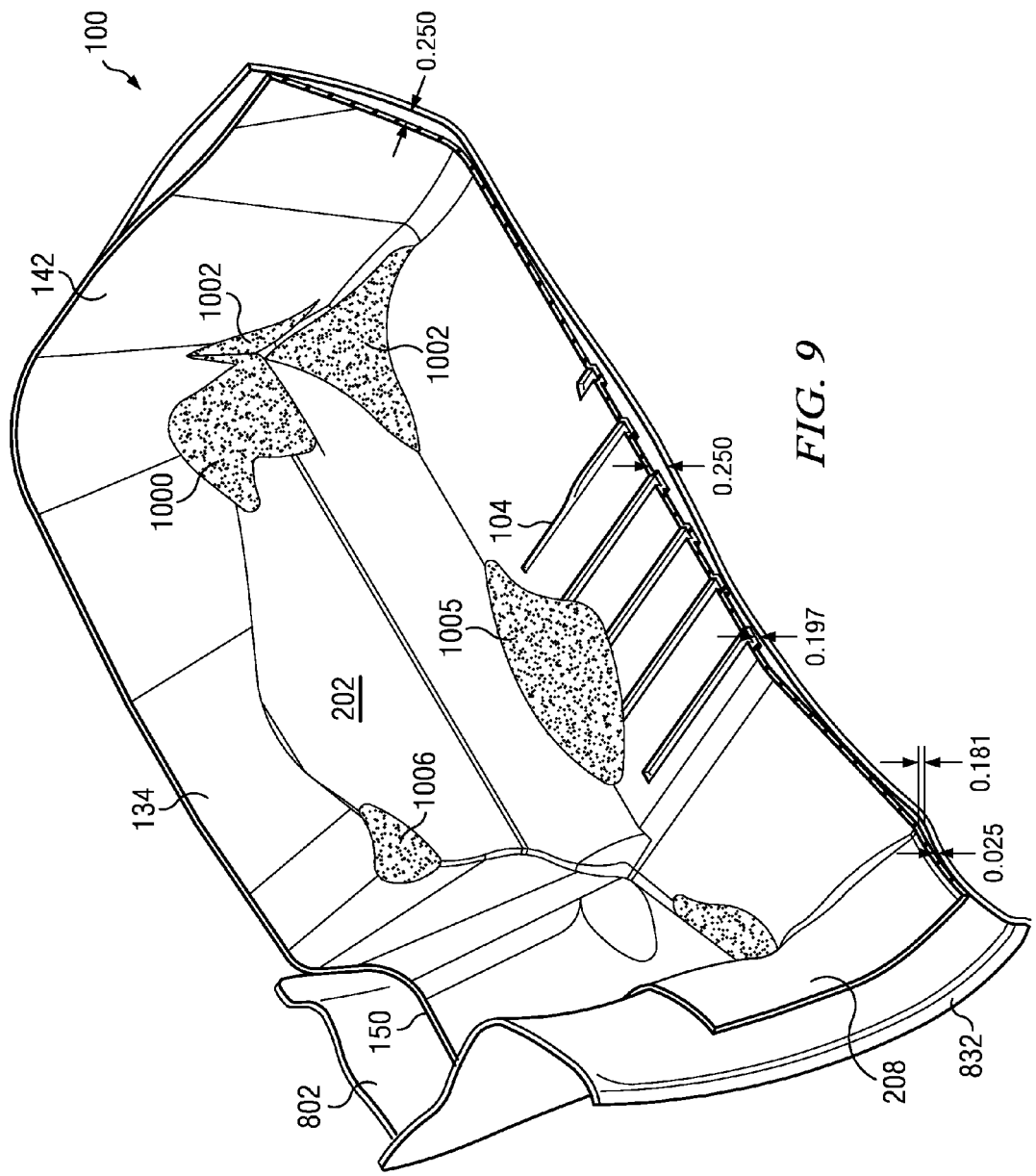
FIG. 9 is a partly transverse sectional, partly isometric view of both the floor tray illustrated in FIG. 2 and the vehicle foot well surface illustrated in FIG. 8, taken substantially along line 9-9 of FIG. 2 and substantially along line 9-9 of FIG. 8.

FIGS. 7 and 8 provide an overview of a process for making the vehicle floor trays or covers according to the invention. The vehicle floor trays or covers are custom-fabricated for discrete vehicle models. At step 700, points on the vehicle foot well for which the floor tray is to be manufactured are digitally measured and captured. Preferably this step uses a coordinate measuring machine (CMM) which records each of a large plurality of points on the surface of the vehicle foot well to which the floor tray is to be fitted. The inventor has found that a FARO® Arm has been efficacious in obtaining these data using a contact method. It has been found that laying out points in linear groups, as by marking the locations to be measured on tape prior to measurement, is efficacious in capturing enough data points to later recreate the surface of which they are a part.

The data thus collected are stored in a file. The points of surface data are spaced from each other as a function of the complexity of the surface on which they reside. Few points of data are needed to establish large surface planes. More points of data are used in defining curved surfaces, with the density of data points varying according to the sharpness of the curve. In FIG. 8, representative ones of these points are shown by small "x"s at 800, on a surface 802 that is reconstituted using the technique described immediately below. A typical data file will contain about a thousand points, spread over an imaged foot well surface area of about ten square feet.

The CMM data file is imported into a CAD program, which is used by a designer to reconstitute a vehicle foot well surface from the captured points. First, at step 701 different "lines" of these points are connected together by B-splines 804. The splines 804, which the CAD program can automatically generate, are used to estimate all of the points on the line other than the captured data points of that line. The splines 804 are separated apart from each other as a function of the topographical complexity of the portion of the surface that they cover. For large flat areas, such as sill plate 806, the splines 804 may be separated far apart, as a plane between the splines is a good estimate of the surface in that area. For complex or tightly curved areas, such as sill curve 832 or kick plate transitional area 833, the splines 804 are tightly packed together because the surface segments have to be small in order to reproduce those curved surfaces of the foot well with acceptable accuracy.

Once the splines 804 have been assembled, the designer lofts an area between each pair of parallel splines 804 in order to create different areal segments 808. The "lofting" process proceeds along each of the major surfaces of the part, piecewise, until that surface is entirely recreated. For example, a transmission tunnel sidewall surface 810 is recreated by lofting an area 812 between a spline 814 to an adjacent spline 816 along the same surface. The designer then lofts the next area 818 from spline 816 to spline 820. Next, an area 822 from spline 820 to spline 824 is added, and so forth down the rest of the transmission tunnel surface 810 until that entire component of the vehicle foot well surface has been created. In similar fashion, the other major surfaces are added: a combination firewall/floor area segment 826, a pedestal sidewall 828, a kick plate segment 830, a sill plate curve 832 and the sill plate 806.

The resultant reconstructed vehicle foot well surface 802 is used, at steps 703-707, 709, 711, 720-726 to construct a vehicle floor tray that fits the surface 802 to an enhanced degree of precision. At step 703, the designer chooses top and bottom sketch planes, which intersect the surface 802 at the top and bottom elevations of the tray to be designed. A top sketch plane intersects surface 802 at a locus (step 720) high up on the sidewalls 810, 828, 830, 832 and 834. This locus is seen in FIG. 1 as a top margin 150 of the upstanding sidewalls 130, 132, 134, 136 and the transitions between them. In the preferred embodiment, the top sketch plane is tilted and inclines upward in a forward direction. This produces a tray which is deeper near the firewall than it is near the seat, preferably producing a tray that is at least five inches deep at its deepest part. This protects the foot well carpet from the possibly muddy sides of an occupant's shoes or boots. A bottom sketch plane is defined to be coplanar with the bottom surface tray sill plate 140, spaced from the vehicle foot well sill plate 806 by a tight tolerance, such as 0.025". This bottom sketch plane does not intersect the remainder of the structure but is instead projected (step 722) upward onto the vehicle foot well surface to create a locus that approximates the marginal outline of the floor/firewall segment 826.

At step 704, sidewalls are drawn in to span the top and bottom sketch planes. These prototypical sidewalls are created by (step 724) first drawing a plurality of straight lines, each drawn from a point on the upper sketch plane locus to a point on the lower sketch plane locus. Since the upper sketch plane is more extensive and has a different shape from the lower sketch plane, the lateral margins of the upper and lower sketch planes are not congruent, and the straight lines drawn from the upper sketch plane may be canted at various angles to each other. In general, these lines will slope inwardly from the top sketch plane to the bottom sketch plane. The areas in between these lines can be lofted (step 726) to create polygonal surfaces of a completed tray solid.

The resultant solid has a planar top surface, nearly planar bottom surface and sidewalls which make abrupt corners with them. The actual transitions between the vehicle foot well sidewall surfaces and the floor are almost always curved, to a greater or lesser extent depending on the area in question and on the vehicle model. Therefore, at step 705, curves are fitted to the reconstructed vehicle foot well surface and these curves are substituted in for the previous abrupt angular shapes. The largest of these curves occurs across the firewall 834, to conform to that sloping and typically curved surface rather than to a horizontal extension of the bottom sketch plane. Curves are also used to modify the transitions between the floor 102 and the transmission tunnel surface 132, the kick plate 136, and the seat pedestal sidewall 130.

The above techniques aim to approximate, as closely as possible, the shape of the upstanding sidewalls 810, 828, 830 and 834, to a zero standoff from the foot well surface. In some instances, the outer surface of the tray 100 may actually extend slightly beyond the imaged side walls of the vehicle foot well (see portions 1000-1006 in FIGS. 10-14), creating a negative standoff. This is permissible to some degree because the surface to which the tray is being shaped is carpeted and the pile may be intentionally depressed at certain points.

The door sill 806 and the sill curve 832 typically are hard surfaces that must comply to close manufacturer tolerances. A vehicle door is designed to mate with these surfaces. Because of this it is important to match these surfaces carefully, and preferably this is done in this process to a preselected standoff of 0.025 inch.

At step 704, and for certain vehicle models, certain radii of the transitional surfaces are increased, in an intentional departure from the foot well surface. This is done, for example, where the curved transition is one from a deep vertical surface to the floor, as might occur between a vertical kick plate and firewall surface segments 836, 838. See transition 1400 in FIG. 14. This is done to make sure that the preferred vacuum molding process, which uses a female tool, does not create a thin place in the molded part at the deep corners. Where the sidewall surfaces are sloped inward by more than five degrees, such radiusing is unnecessary.

At step 707, which can be before, during or after steps 704 and 705, the tray solid is additionally modified to take into account irregularities in the reconstructed foot well surface. For example, the vehicle carpeting might have had rolls or wrinkles in it that should not be reproduced in a tray meant to fit the vehicle. This steps also smoothes out those surface irregularities which are artifacts of the surface acquisition and reconstruction steps 700-702.

Once a basic shape for the vehicle floor tray has been formed, it is modified at 709 in order to create the reservoir 110 and channels 104 (See FIGS. 1-4). This modification is necessary because, as has been explained, while there is a close conformance or mating between most of the exterior or lower surfaces of the floor tray on the one hand to the upper or interior surfaces of the vehicle foot well surfaces on the other, there must be a departure from this close conformance in order to create the profile needed by the reservoir and channels. In a preferred embodiment, a predetermined file containing the outer surface of the reservoir and channel surface is integrated into the floor of the tray solid. The importation of this design into the floor of the tray solid will cause a departure from the imaged vehicle surface floor of as much as ¼ inch in the areas around the reservoir periphery. This departure decreases as a function of distance from the imported pattern. The produced vehicle floor tray will nonetheless fit tightly to the vehicle foot well, because (1) the floor carpeting will be depressed to a greater extent under the reservoir than in peripheral areas (see, e.g., region 1004 in FIG. 10), and (2) the upstanding sidewalls continue to closely conform to the corresponding surfaces of the vehicle foot well.

At step 711, the tray solid developed at steps 703-707, 709 is "shelled". This means that the solid is carved out to leave a thin layer that is a uniform thickness (preferably about 0.120-0.125 in.) from the outer surface.

The result is a tray data file 708 that is a complete representation of both the upper and lower surfaces of the floor tray, to a precision sufficient to create only a ⅛ in. departure or less from a large portion of the respective surfaces of the vehicle foot well. This data file, typically as translated into a .stl format that approximates surfaces with a large plurality of small triangles, is used at 710 to command a stereolithographic apparatus (SLA). The SLA creates a solid plastic image or model of the design by selectively curing liquid photopolymer using a laser. The SLA is used to determine fit to an actual vehicle foot well and to make any necessary adjustments.

As modified with experience gained from fitting the SLA, at 712 the vehicle tray data file is used to make a commercial mold for producing the vehicle floor trays or covers. Triextruded sheets or blanks 714 are placed in the mold and heated to produce the vehicle floor trays at 716.

Three-dimensional vehicle floor trays for many different vehicle models can be quickly and accurately manufactured using this method. The method can also be modified to produce double trays, in which a single tray is provided which covers both driver and passenger vehicle foot wells as well as the intervening transmission tunnel. The technique can be used to create other vehicle floor covers as well, such as the liners used in the cargo areas of minivans and SUVs.

In summary, a novel vehicle floor tray has been shown and described which fits, within tight tolerances, to the vehicle foot well for which it is created. The floor tray according to the invention includes a reservoir and channel system for retaining runoff in a way that will not slosh around in the foot well. By using a triextruded sheet blank, the tray combines the desirable coefficient of friction and yieldability characteristics of a thermoplastic elastomer, the lower cost of a polyolefin and a toughness that exceeds either material taken alone.

While an illustrated embodiment of the present invention has been described and illustrated in the appended drawings, the present invention is not limited thereto but only by the scope and spirit of the appended claims.

We claim:

1. A vehicle floor tray thermoformed from a sheet of thermoplastic polymeric material of substantially uniform thickness, comprising:
   a central panel substantially conforming to a floor of a vehicle foot well, the central panel of the floor tray having an upper surface, at least one generally longitudinally disposed lateral side and at least one generally transversely disposed lateral side;
   a first side panel integrally formed with the central panel of the floor tray, upwardly extending from the transversely disposed lateral side of the central panel of the floor tray, and substantially conforming to a first foot well wall, the first side panel of the floor tray joined to the central panel of the floor tray by a curved transition;
   a second side panel integrally formed with the central panel of the floor tray and the first side panel, upwardly extending from the longitudinally disposed lateral side of the central panel of the floor tray, and substantially conforming to a second foot well wall, the second side panel of the floor tray joined to the central panel of the floor tray by a curved transition, the second side panel of the floor tray being joined to the first side panel of the floor tray by a curved transition at a first junction, the first and second side panels each having a top margin, a vertical height of the first side panel as measured from the upper surface of the central panel of the floor tray to the top margin of the first side panel at the first junction being substantially similar to a vertical height of the second side panel as measured from the upper surface of the central panel of the floor tray to the top margin of the second side panel at the first junction;
   a reservoir disposed in the central panel of the floor tray;
   a plurality of upstanding, hollow, elongate baffles disposed in the reservoir, each of the baffles having at least two ends remote from each other, the central panel, the first panel, the second panel, the reservoir and the baffles each having a thickness from a point on the upper surface to a closest point on a lower surface thereof, said thicknesses, as a result of the tray being thermoformed from the sheet of thermoplastic polymeric material of substantially uniform thickness, being substantially uniform throughout the tray;
   the baffles each having a width, in any horizontal direction, of more than two times its thickness, the baffles adapted to elevate the shoe or foot of an occupant above fluid collected in the reservoir, and further adapted to impede lateral movement, induced by a change in vehicle speed or direction, of fluid collected in the reservoir, any portion of the reservoir connected to a remote portion of the reservoir by a path formed around ends of the baffles.

2. The floor tray of claim 1, further comprising a third side panel integrally formed with the central panel of the floor tray and joined to a third lateral side of the central panel by a curved transition, the third side panel joined to the first side panel by a curved transition at a second junction, the third side panel having a top margin, a vertical height as measured from the upper surface of the central panel of the floor tray to the top margin of the third side panel being substantially similar to a vertical height as measured from the central panel of the floor tray to the top margin of the first side panel at the second junction.

3. The floor tray of claim 2, further comprising a fourth side panel integrally formed with the central panel of the floor tray and joined to at least one of the second and third side panels by curved transitions, the fourth side panel upwardly extending from a fourth lateral side of the central panel of the floor tray.

4. The floor tray of claim 1, wherein a distance from the top margin of at least one of the first and second side panels to the central panel of the floor tray is at least five inches at its greatest separation therefrom.

5. The floor tray of claim 1, wherein the first and second side panels have top margins which are substantially coplanar with each other.

6. The floor tray of claim 1, wherein ones of the baffles include longitudinal portions for impeding side-to-side lateral movement of fluid.

7. The floor tray of claim 1, wherein the reservoir is formed in a rearward region of the central panel.

8. The floor tray of claim 1, wherein the upper surface of the tray central panel includes a general upper surface and a reservoir upper surface generally disposed below the general upper surface, the baffles upwardly extending from the reservoir upper surface, the general upper surface of the tray central panel surrounding the reservoir upper surface on all sides.

9. A product line including a plurality of consumer-installable vehicle floor trays each thermoformed from a sheet of thermoplastic polymeric material of substantially uniform thickness, the product line comprising:

a first, driver's side floor tray having a first central panel substantially conforming to a floor of a first, driver's side vehicle foot well of a first vehicle, the first central panel having an upper surface, a generally transversely disposed first lateral side and a generally longitudinally disposed second lateral side, an upstanding generally transverse first side panel of the first tray, the first side panel substantially conforming to a first wall of the first vehicle foot well, integrally formed with the first central panel and joined to the first lateral side of the first central panel by a curved transition;

an upstanding generally longitudinal second side panel substantially conforming to a second wall of the first vehicle foot well, the second side panel integrally formed with the first central panel and the first side panel, the second side panel joined to the second side of the first central panel by a curved transition, the first side panel joined to the second side panel at a first junction by a curved transition, the first and second side panels each having a top margin, a vertical height of the first side panel as measured from the upper surface of the first central panel to the top margin of the first side panel at the first junction being substantially similar to a vertical height of the second side panel as measured from the upper surface of the first central panel to the top margin of the second side panel at the first junction;

a first reservoir formed in the first central panel, a plurality of upstanding, hollow, elongate first baffles formed in the first reservoir, each of the first baffles having at least two ends remote from each other, the first baffles adapted to elevate the shoe or foot of an occupant above fluid collected in the first reservoir, any portion of the first reservoir connected to a remote portion of the first reservoir by a path formed around ends of the first baffles, the first baffles having a thickness from the upper surface of the first central panel to an opposed lower surface thereof, the first baffles each having a width, in any lateral direction, of more than two times its thickness; and a second, driver's side floor tray having a second central panel substantially conforming to a floor of a second, driver's side vehicle foot well of a second vehicle, the second vehicle foot well having a shape which is different from the first vehicle foot well, the second central panel having an upper surface, a generally transversely disposed third side and a generally longitudinally disposed fourth side;

an upstanding generally transverse third side panel of the second driver's side floor tray, the third side panel substantially conforming to a third wall of the second vehicle foot well, the third side panel integrally formed with the second central panel and joined to the third side of the second central panel by a curved transition;

an upstanding generally longitudinal fourth side panel of the second driver's side floor tray, the fourth side panel substantially conforming to a fourth wall of the second vehicle foot well, the fourth side panel integrally formed with the second central panel and joined to the fourth side of the second central panel by a curved transition, the fourth side panel being joined to the third side panel by a curved transition at a second junction, the third side panel and the fourth side panel each having a top margin, a vertical height of the fourth side panel from the upper surface of the second central panel to the top margin of the fourth side panel measured at the second junction being substantially similar to a vertical height of the third side panel from the upper surface of the second central panel to the top margin of the third side panel measured at the second junction; and a second reservoir formed in the second central panel, a plurality of upstanding, hollow second baffles formed in the second reservoir, each of the second baffles having at least two ends remote from each other, the baffles adapted to elevate the shoe or foot of an occupant above fluid collected in the second reservoir, any portion of the second reservoir connected to a remote portion of the second reservoir by a path formed around ends of the second baffles, the second baffles having a thickness from the upper surface of the second central panel to an opposed lower surface thereof, the second baffles each having a width, in any horizontal direction, of more than two times its thickness.

10. The product line of claim 9, wherein the top margins of the first and second side panels are substantially coplanar with each other and wherein the top margins of the third and fourth side panels are substantially coplanar with each other.

11. The product line of claim 9, wherein the first reservoir is formed in a rearward region of the first central panel and wherein the second reservoir is formed in a rearward region of the second central panel.

12. The product line of claim 9, wherein a distance from the top margin of at least one of the first and second side panels to the first central panel is at least five inches at its greatest separation therefrom, and wherein a distance from the top margin of at least one of the third and fourth side panels to the second central panel is at least five inches at its greatest separation therefrom.

13. The product line of claim 9, wherein for each of the first and second floor trays, the tray central panel includes a general upper surface and a reservoir upper surface generally disposed below the general upper surface, the baffles upwardly extending from the reservoir upper surface, each respective general tray upper surface surrounding a respective reservoir upper surface on all sides.

14. The product line of claim 9, wherein the first central panel has a generally longitudinally disposed fifth side and the second central panel has a generally longitudinally disposed sixth side, the first floor tray further including an upstanding generally longitudinal fifth side panel joined to the fifth side of the first central panel by a curved transition, the fifth side panel joined to the first side panel by a curved transition at a third junction, the fifth side panel having a top margin, a vertical height of the fifth side panel measured from the upper surface of the first central panel to the top margin of the fifth side panel at the third junction being substantially the same as a vertical height of the first side panel as measured from the upper surface of the first central panel to the top margin of the first side panel at the third junction;

The second floor tray further including an upstanding generally longitudinal sixth side panel joined to the sixth side of the second central panel by a curved transition, the sixth side panel joined to the third side panel by a curved transition at a fourth junction, the sixth side panel having a top margin, a vertical height of the sixth side panel measured from the upper surface of the second central panel to the top margin of the sixth side panel at the fourth junction being substantially similar to a vertical height of the third side panel measured from the upper surface of the second central panel to the top margin of the third side panel at the fourth junction.

15. The product line of claim 9, further comprising:
a third, passenger's side floor tray having
a third central panel substantially conforming to a floor of a third, passenger's side vehicle foot well disposed in the first vehicle, the third central panel having an upper surface, a generally transversely disposed fifth side and a generally longitudinally disposed sixth side, a third reservoir formed in the third central panel, a plurality of upstanding, hollow third baffles formed in the third reservoir, each of the third baffles having at least two ends remote from each other, the third baffles adapted to elevate the shoe or foot of an occupant above fluid collected in the reservoir and further adapted to impede lateral movement, induced by a change in vehicle speed or direction, of fluid collected in the third reservoir, any portion of the third reservoir connected to a remote portion of the third reservoir by a path formed around ends of the third baffles;
an upstanding generally transversely disposed fifth side panel of the third, passenger's side floor tray, the fifth side panel substantially conforming to a fifth wall of the passenger's side vehicle foot well in the first vehicle, the fifth side panel integrally formed with the third central panel and joined to the fifth side of the third central panel by a curved transition;
an upstanding generally longitudinally disposed sixth side panel of the third, passenger's side floor tray, the sixth side panel substantially conforming to a sixth wall of the passenger's side vehicle foot well in the first vehicle, the sixth side panel integrally formed with the third central panel and the fifth side panel and joined to the third central panel by a curved transition, the sixth side panel joined to the fifth side panel by a curved transition at a third junction, the fifth and sixth side panels each having a top margin, a vertical height of the fifth side panel from the upper surface of the third central panel to the top margin of the fifth side panel measured at the third junction being substantially similar to a vertical height of the sixth side panel from the upper surface of the third central panel to the top margin of the sixth side panel measured at the third junction; and
a fourth, passenger's side floor tray having
a fourth central panel substantially conforming to a floor of a fourth, passenger's side vehicle foot well disposed in the second vehicle, the fourth central panel having an upper surface, a generally transversely disposed seventh side and a generally longitudinally disposed eighth side, a fourth reservoir formed in the fourth central panel, a plurality of upstanding, hollow fourth baffles formed in the fourth reservoir, each of the fourth baffles having at least two ends remote from each other, the fourth baffles adapted to elevate the shoe or foot of an occupant above fluid collected in the fourth reservoir, any portion of the fourth reservoir connected to a remote portion of the fourth reservoir by a path formed around ends of the fourth baffles, the fourth baffles further adapted to impede lateral movement, induced by a change of vehicle speed or direction, of fluid collected in the fourth reservoir, any portion of the fourth reservoir connected to a remote portion of the fourth reservoir by a path formed around ends of the fourth baffles;
an upstanding generally transversely disposed seventh side panel substantially conforming to a seventh wall of the fourth vehicle foot well, the seventh side panel integrally formed with the fourth central panel and joined to the seventh side of the fourth central panel by a curved transition; and
an upstanding generally longitudinally disposed eighth side panel substantially conforming to an eighth wall of the fourth vehicle foot well, the eighth side panel integrally formed with the fourth central panel and the seventh side panel, the eighth side panel joined to the eighth side of the fourth central panel by a curved transition, the eighth side panel joined to the seventh side panel by a curved transition at a fourth junction, the seventh and eighth side panels each having a top margin, a vertical height of the eighth side panel from the upper surface of the fourth central panel to the top margin of the eighth side panel being substantially similar to a vertical height of the seventh side panel from the upper surface of the fourth central panel to the top margin of the seventh side panel measured at the fourth junction;
wherein the third and fourth floor trays are of different shapes and are custom-fit to the respective third and fourth passenger's side vehicle foot wells.

16. The product line of claim 15, wherein the top margins of the fifth and sixth side panels are substantially coplanar with each other and wherein the top margins of the seventh and eighth side panels are substantially coplanar with each other.

17. The product line of claim 15, wherein the third reservoir is formed in a rearward region of the third central panel and wherein the fourth reservoir is formed in a rearward region of the fourth central panel.

18. The product line of claim 15, wherein a distance from the top margin of at least one of the fifth and sixth side panels to the third central panel is at least five inches at its greatest separation therefrom, and wherein a distance from the top margin of at least one of the seventh and eighth side panels to the fourth central panel is at least five inches at its greatest separation therefrom.

19. The product line of claim 15, wherein for each of the first and second floor trays, the tray central panel includes a general upper surface and a reservoir upper surface generally disposed below the general upper surface, the baffles upwardly extending from the reservoir upper surface, each respective general tray upper surface surrounding a respective reservoir upper surface on all sides.

20. The product line of claim 15, and further comprising:
a generally longitudinally disposed ninth side panel of the third, passenger's side floor tray, the ninth side panel substantially conforming to a ninth wall of the third, passenger's side vehicle foot well in the first vehicle, the third central panel having a generally longitudinally disposed ninth side, the ninth side panel joined to the ninth side of the third central panel by a curved transition, the ninth side panel joined to the fifth side panel of the third floor tray by a curved transition at a fifth junction, the ninth side panel having a top margin, a vertical height of the ninth side panel from the upper surface of the third central panel to the top margin of the ninth side panel measured at the fifth junction being substantially similar to a vertical height of the fifth side panel from the upper surface of the third central panel to the top margin of the fifth side panel measured at the fifth junction; and
a generally longitudinally disposed tenth side panel of the fourth, passenger's side floor tray, the tenth side panel substantially conforming to a tenth wall of the fourth, passenger's side foot well in the second vehicle, the fourth central panel having a generally longitudinally disposed tenth side, the tenth side panel joined to the tenth side of the fourth central panel by a curved transition, the tenth side panel joined to the seventh side panel of the fourth floor tray by a curved transition at a sixth junction, the tenth side panel having a top margin, a vertical height of the tenth side panel from the upper surface of the fourth central panel to the top margin of the tenth side panel measured at the sixth junction being substantially similar to a vertical height of the seventh side panel from the upper surface of the fourth central panel to the top margin of the seventh side panel measured at the sixth junction.

* * * * *